(12) United States Patent
Novoselov et al.

(10) Patent No.: US 10,067,336 B1
(45) Date of Patent: Sep. 4, 2018

(54) PIXEL WALL AND SPACER CONFIGURATION FOR AN ELECTROWETTING DISPLAY

(71) Applicant: Amazon Technologies, Inc., Seattle, WA (US)

(72) Inventors: Pavel Novoselov, Eindhoven (NL); Gor Manukyan, Veldhoven (NL); Tulasi Sridhar Reddy Guntaka, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/274,996

(22) Filed: Sep. 23, 2016

Related U.S. Application Data

(62) Division of application No. 14/559,861, filed on Dec. 3, 2014, now Pat. No. 9,465,207.

(51) Int. Cl.
*G02B 26/00* (2006.01)
*G02B 26/02* (2006.01)

(52) U.S. Cl.
CPC ................... *G02B 26/005* (2013.01)

(58) Field of Classification Search
CPC .... G02B 26/004; G02B 26/005; G02B 26/02; G09G 3/34; G09G 3/348; G09G 2300/04; G09G 230/0452; G09G 2300/0809; B01L 2400/04; B01L 2400/0427; B23B 2307/73
USPC ....................... 359/226.3, 228, 290–292, 665
See application file for complete search history.

(56) References Cited

U.S. PATENT DOCUMENTS

| | | |
|---|---|---|
| 7,510,638 B2 | 3/2009 | Herman et al. |
| 7,636,187 B2 | 12/2009 | Morozumi et al. |
| 7,813,030 B2 | 10/2010 | Lo et al. |
| 8,059,328 B1 | 11/2011 | Kuo et al. |
| 8,241,731 B2 | 8/2012 | Ohgaki et al. |
| 8,416,488 B2 | 4/2013 | Hayes et al. |
| 8,854,718 B2 | 10/2014 | Jung et al. |
| 9,069,161 B2 | 6/2015 | Hayes et al. |
| 9,140,892 B2 | 9/2015 | Hendriks et al. |
| 9,182,589 B2 | 11/2015 | Sakai et al. |
| 9,274,331 B2 | 3/2016 | Feil |
| 9,465,207 B1 | 10/2016 | Novoselov et al. |
| 9,529,186 B1 | 12/2016 | Schram |
| 9,547,167 B1 | 1/2017 | Sakai et al. |
| 9,709,799 B2 | 7/2017 | Chen |

(Continued)

OTHER PUBLICATIONS

Office action for U.S. Appl. No. 15/153,373, dated Aug. 11, 2017, Novoselov, "Pixel Wall and Spacer Configuration for an Electrowetting Display", 7 pages.

*Primary Examiner* — Tuyen Tra
(74) *Attorney, Agent, or Firm* — EIP US LLP

(57) ABSTRACT

A method for fabricating an electrowetting display may include depositing a first material layer on a support plate; placing a first mask on the first material layer, wherein the first mask covers first portions of the first material layer and does not cover second portions of the first photoresist layer; exposing second portions of the first material layer to electromagnetic radiation; depositing a second material layer on the first mask and the exposed second portions of the first material layer; placing a second mask on the second material layer; and etching to remove portions of the second material layer and the second portions of the first material layer. Portions of the first and second material layers that remain subsequent to the etching form spacers and a grid of pixel wall extensions.

20 Claims, 16 Drawing Sheets

(56) References Cited

U.S. PATENT DOCUMENTS

2013/0301105 A1 11/2013 Kim et al.
2014/0029080 A1 1/2014 Hwang

PIXEL WALL AND SPACER CONFIGURATION FOR AN ELECTROWETTING DISPLAY

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, finding ways to enhance user experience and satisfaction continues to be a priority. Moreover, increased multimedia use imposes high demands on designs, packaging, and fabricating display devices, as content available for mobile use becomes more extensive and device portability continues to be a high priority.

An electrowetting display includes an array of pixels individually bordered by pixel walls that retain fluid, such as opaque oil, for example. Light transmission through each pixel is adjustable by electronically controlling a position of the fluid in the pixel. Resolution and quality of an electrowetting display may depend on a number of factors, such as optical transmissivity or reflectivity of material layers of the electrowetting display and pixel size, just to name a few examples.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
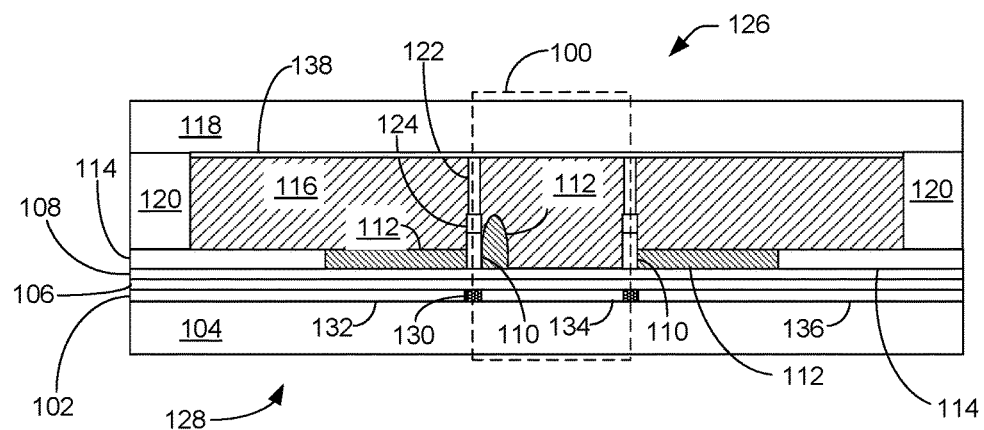
FIG. 1 illustrates a cross-section of a portion of an electrowetting display device, according to some embodiments.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like. Various embodiments described herein include structures that may be included in electrowetting displays and techniques for fabricating such structures.

In some embodiments, an electrowetting display device includes a first support plate and an overlying second support plate and a plurality of pixel regions therebetween. Each of the pixel regions may include one or more hydrophobic surfaces, an oil, and an electrolyte solution at least partially surrounding the oil. Bottom portions of pixel regions may be partitioned or delineated from one another by pixel walls disposed on the first support plate. Spacers that mechanically connect the first support plate with the second support plate, or which form a separation between the first support plate and the second support plate, contribute to mechanical integrity of the electrowetting display.

In some embodiments, spacers may be fabricated on tops of pixel walls disposed on the first support plate. This is in contrast to fabricating spacers on a second support plate. In the latter case, the spacers are aligned with and joined to tops of pixel walls disposed on a first support plate. Such alignment may be relatively difficult. To alleviate some of the difficulty with alignment, spacers fabricated on the second support plate may be intentionally wider than the pixel walls. Unfortunately, the extra width of the spacers extends beyond the widths of the pixel walls and protrudes into the pixel space (aperture of the pixel) where light transmits in the pixel. This protrusion of the spacers into the apertures of the pixels of an electrowetting display may block a portion of the light transmitting in the pixels of the electrowetting display and may lead to reduced brightness and reduced contrast ratio. Moreover, protrusion of the spacers into the apertures of the pixels may interfere with flow of oil in the pixels.

Accordingly, the formerly stated embodiments of fabricating spacers on tops of pixel walls disposed on the first support plate may provide a number of benefits. For example, alignment and mating of the spacers with tops of the pixel walls need not occur because the spacers are formed on top of the pixel walls in a self-aligning process. Accordingly, the spacers may have a width that is about the same as or substantially narrower than widths of the pixel walls. Pixel apertures, therefore, need not be reduced by spacers that are wider than pixel walls. As another benefit, spacers formed on pixel walls may be more robust as compared to spacers that are merely positioned adjacent to pixel walls (e.g., sans a mechanical adhesion).

In other embodiments, pixel wall extensions may be formed on spacers that are disposed on a second support plate. Such pixel wall extensions may be subsequently joined to tops of pixel walls disposed on a first support plate. Accordingly, after assembly of an electrowetting display that includes the first and second support plates, the pixel wall extensions add to the height of the pixel walls disposed on the first support plate. The resulting extra wall height provides a number of benefits. For example, extra wall height may help prevent oil from "spilling" over pixel walls from one pixel region to an adjacent pixel region. Such spilling may potentially occur as a result of physical shock (e.g., external impact) imposed on the electrowetting display device, for example. Such spilling may also occur if a pixel is operated with a driving voltage that is relatively large. In this case, oil may be displaced "tightly" against pixel walls toward an edge of the pixel. Because forces inducing such displacement are primarily in a horizontal (e.g. parallel with the support plates) direction, the displaced oil tends to be squeezed in an upward direction along the pixel walls resulting in a relatively tall bead of oil. Such a tall bead of oil may spill over (e.g., overflow) the pixel walls. Adding pixel wall extensions to increase the overall height of the pixel walls may prevent such overflow, thus allowing pixels to be operated at relatively large driving voltages, which can improve brightness and contrast ratio of an electrowetting display.

In some embodiments, techniques for fabricating pixel wall extensions of spacers that are disposed on a top plate may involve a self-alignment process that automatically aligns the spacers with the pixel wall extensions. Accordingly, spacers may have about the same as or substantially less than the width of the pixel wall extensions, thus avoiding spacer protrusion into the apertures of the pixels so that brightness and contrast ratio may be improved for an electrowetting display.

In some embodiments, pixel wall extensions and spacers may be disposed in a grid layer that is not part of a second support plate, for example. In other words, such a grid layer may be a stand-alone layer or foil, which may be subsequently joined to a second support plate or tops of pixel walls disposed on a first support plate. The grid layer may comprise a substantially planar grid of intersecting pixel wall extensions that include spacers protruding perpendicularly therefrom.

In a number of embodiments, a display device, such as an electrowetting display device, may be a transmissive, reflective or transflective display that generally includes an array of pixels (e.g., or subpixels) configured to be operated by an active matrix addressing scheme. For example, rows and columns of electrowetting pixels are operated by controlling voltage levels on a plurality of source lines and gate lines. In this fashion, the display device may produce an image by selecting particular pixels to at least partly transmit, reflect or block light. Pixels are addressed (e.g., selected) via rows and columns of the source lines and gate lines that are electrically connected to transistors (e.g., used as switches) included in each pixel. Transistors take up a relatively small fraction of the area of each pixel. For example, the transistor may be located underneath the reflector in reflective displays. Herein, a pixel may, unless otherwise specified, comprise a single subpixel or a pixel that includes two or more subpixels of an electrowetting display device. Such a pixel or subpixel may be the smallest light transmissive, reflective and/or transflective element of a display that is individually operable to directly control an amount of light transmission through and reflection from the element. For example, in some implementations, a pixel may be a pixel that includes a red subpixel, a green subpixel, and a blue subpixel. In other implementations, a pixel may be a pixel that is a smallest component, e.g., the pixel does not include any subpixels.

Electrowetting displays include an array of pixels comprising pixels and/or subpixels sandwiched between two support plates, such as a substrate and a top plate. For example, the substrate may be a first support plate that, in cooperation with the top support plate, encloses pixel regions that include oil, electrolyte solution, and pixel walls between the support plates. Support plates may include glass, plastic (e.g., a transparent thermoplastic such as PMMA or other acrylic), or other material and may be made of a rigid or flexible material, for example.

Pixels include various layers of materials built upon a first support plate. One such layer may be a hydrophobic layer like amorphous fluoropolymer (e.g. Teflon® AF1600).

Hereinafter, example embodiments describe reflective electrowetting displays comprising an array of pixels sandwiched between a first support plate and a second support plate. The first support plate may be opaque while the second support plate may be transparent. Herein, describing an element or material as being "transparent" means that the element or material may transmit a relatively large fraction of the light incident upon it. For example, a transparent substrate or layer may transmit more than 70% or 80% of the light impinging on its surface, though claimed subject matter is not limited in this respect.

Pixel walls retain at least a first fluid which is electrically non-conductive or nonpolar such as opaque or colored oil, in the individual pixel regions. A cavity formed between the support plates is filled with the first fluid (e.g., the first fluid being retained by pixel walls) and a second fluid (e.g., considered to be an electrolyte solution) that is electrically conductive or polar and may be a water solution, such as a mixture of water and ethyl alcohol, or a salt solution, such as a solution of potassium chloride in water. The second fluid may be transparent, but may be colored, or light-absorbing. The second fluid is substantially immiscible with the first fluid. Herein, substances are immiscible with one another if the substances do not substantially form a solution.

In some embodiments, individual reflective electrowetting pixels may include a reflective layer on the first support plate of the electrowetting pixel, a conductive layer (e.g. a transparent electrode layer) adjacent to the reflective layer, and a hydrophobic layer on the conductive layer. Pixel walls of each pixel, the hydrophobic layer, and the transparent second support plate at least partially enclose a fluid region that includes electrowetting fluids, such as an electrolyte solution and an opaque fluid, which is immiscible with the electrolyte solution. An "opaque" fluid, as described herein, is used to describe a fluid that appears black or colored to an observer. For example, a black opaque fluid strongly absorbs a broad spectrum of wavelengths (e.g., including those of red, green and blue) in the visible region of electromagnetic radiation. In some implementations, the opaque fluid is a nonpolar oil.

The opaque fluid is disposed in the fluid region. As described in detail below, coverage area of the opaque fluid on the bottom hydrophobic layer is electronically adjustable to affect the amount of light incident on the reflective electrowetting display that reaches the reflective material at the bottom of each pixel.

In addition to pixels, spacers and edge seals may also be located between two support plates. Spacers and edge seals which mechanically connect a first support plate with a second overlying support plate, or which form a separation between the first support plate and the second support plate, contribute to mechanical integrity of the electrowetting display. Edge seals, for example, being disposed along a periphery of an array of electrowetting display device pixels, may contribute to retaining electrowetting fluids between the first support plate and the second overlying support plate.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient light) or out-coupled from a light guide of the display device. For example, display software may include code executable by a processor to modulate optical properties of individual pixels of the electrowetting display based, at least in part, on electronic signals representative of image or video data. The code may cause the processor to modulate the optical properties of pixels by controlling electrical signals (e.g., voltages, currents, fields, and so on) on, over, or in layers of the electrowetting display.

FIG. 1 is a cross-section of a portion of a reflective electrowetting display device illustrating several electrowetting pixels 100, according to some embodiments. Though three such electrowetting pixels are illustrated, an electrowetting display device may include any number (usually a very large number, such as thousands or millions) of electrowetting pixels. An electrode layer 102 is formed on a first support plate 104 and may comprise one or more individual electrodes in each electrowetting pixel.

In various embodiments, electrode layer 102 may be connected to any number of thin film transistors (TFTs) (not illustrated) that are switched to either select or deselect electrowetting pixels 100 using active matrix addressing, for example. A TFT is a particular type of field-effect transistor that includes thin films of an active semiconductor layer as well as a dielectric layer and metallic contacts over a supporting (but non-conducting) substrate, which may be glass or any of a number of other transparent or non-transparent materials, for example.

In some implementations, a dielectric barrier layer 106 may at least partially separate electrode layer 102 from a hydrophobic layer 108 also formed on first support plate 104. For example, hydrophobic layer 108 may at least cover electrode layer 102 and there may be additional layers between the electrode layer and the hydrophobic layer, e.g. a dielectric layer 106. In some implementations, hydrophobic layer 108 may comprise any of a number of types of fluoropolymers, such as AF1600®, produced by DuPont, based in Wilmington, Del. Hydrophobic layer 108 may also be any of a number of water-repelling materials that affect wettability of an adjacent material, for example. Herein, the term "hydrophobic" is used to describe a material or layer that is hydrophobic relative to other materials or layers. For example, a hydrophobic layer need not be 100% hydrophobic, though the hydrophobicity of the layer may be relatively high. Hydrophobicity of a "hydrophobic material" or "hydrophobic layer" may change under various circumstances or conditions.

Pixel walls 110 form a patterned electrowetting pixel grid that may be disposed on hydrophobic layer 108 or electrode layer 102, for example. Pixel walls 110 may comprise a photoresist material such as, for example, epoxy-based negative photoresist SU-8. The patterned electrowetting pixel grid comprises rows and columns that form an array of electrowetting pixels. For example, an electrowetting pixel may have a width and length in a range of about 50 to 500 microns. In some implementations, a hydrophobic layer or region may be disposed on portions of pixel walls 110 (not illustrated in FIG. 1). Herein, "disposed on" includes the possibility of intermediate layers (e.g., "disposed on" need not mean "directly on").

A first fluid 112, which may have a thickness (e.g., depth) in a range of about 1 to 10 microns, for example, overlies hydrophobic layer 108. First fluid 112 is partitioned by pixel walls 110 of the patterned electrowetting pixel grid. An outer rim 114 may comprise the same material as pixel walls 110. A second fluid 116, such as an electrolyte solution, overlies first fluid 112 and pixel walls 110 of the patterned electrowetting pixel grid. First fluid 112 is immiscible with second fluid 116 so that the first fluid and the second fluid do not substantially mix with each other, and in some examples do not mix with each other to any degree. Second fluid 116 is preferably transparent, but may be colored or absorbing. First fluid 112 is electrically non-conductive and may for instance be an alkane like hexadecane or (silicone) oil.

A second support plate 118 covers second fluid 116 and edge seals 120 maintain second fluid 116 over the electrowetting pixel array. Support plate 118 may be supported by edge seals 120 and spacers 122 that are interspersed throughout the array of pixels 100. Pixel wall extensions 124 are disposed on pixel walls 110 and spacers 122 extend from pixel wall extensions 124 to second support plate 118.

A voltage applied across second fluid 116 and hydrophobic layer 108 of individual electrowetting pixels may control transmittance or reflectance of the individual electrowetting pixels.

The reflective electrowetting display device has a viewing side 126 on which an image formed by the electrowetting display device may be viewed, and a rear side 128. Second support plate 118 faces viewing side 126 and first support plate 104 faces rear side 128. The electrowetting display device may be an active matrix driven display type or a passive matrix driven display, just to name a few examples.

Separation block 130 represents a discontinuity of electrical conductivity along electrode layer 102. For example, a first portion 132 of electrode layer 102 may be electrically insulated or separated from a second portion 134 and a third portion 136 of electrode layer 102 so that each portion 132, 134, and 136 is connected to a respective pixel region. A region of electrowetting pixel 100 between the first support plate and the second support plate may be referred to as a pixel region.

In some embodiments, electrowetting pixels may include a top electrode 138 disposed on second support plate 118, one or more color filters (not illustrated), or a black matrix (not illustrated).

Hydrophobic layer 108 is arranged on first support plate 104 to create an electrowetting surface area. The hydrophobic character causes first fluid 112 to adhere preferentially to first support plate 104 since first fluid 112 has a higher wettability with respect to the surface of hydrophobic layer 108 than second fluid 116. Wettability relates to the relative affinity of a fluid for the surface of a solid. Wettability increases with increasing affinity, and it may be measured by the contact angle formed between the fluid and the solid and is measured internal to the fluid of interest. For example, such a contact angle may increase from relative non-wettability of more than 90° to complete wettability at 0°, in which case the fluid tends to form a film on the surface of the solid. As an example of behavior of first fluid 112 in a pixel region in an active state, the center pixel region in FIG. 1 is depicted to be in such a state, so that first fluid 112 gathers toward an edge of the pixel region, for example.

First fluid 112 absorbs at least a part of the optical spectrum. First fluid 112 may be transmissive for a part of the optical spectrum, forming a color filter. For this purpose, the fluid may be colored by addition of pigment particles or dye, for example. Alternatively, first fluid 112 may be colored or black (e.g., absorbing substantially all parts of the optical spectrum) or reflecting.

If a voltage is applied across electrowetting pixel 100, electrowetting pixel 100 will enter into an active state. Electrostatic forces will move second fluid 116 toward electrode layer 102, thereby displacing first fluid 112 from the area of hydrophobic layer 108 to pixel walls 110 surrounding the area of hydrophobic layer 108, to a droplet-like shape. Such displacing action uncovers first fluid 112 from the surface of hydrophobic layer 108 of electrowetting pixel 100.

If the voltage across electrowetting pixel 100 is returned to an inactive signal level of zero or a value near to zero, electrowetting pixel 100 will return to an inactive state, where first fluid 112 flows back to cover hydrophobic layer 108. In this way, first fluid 112 forms an electrically controllable optical switch in each electrowetting pixel 100. Of course, such details of an electrowetting display device are merely examples, and claimed subject matter is not limited in this respect.

Figure 2:
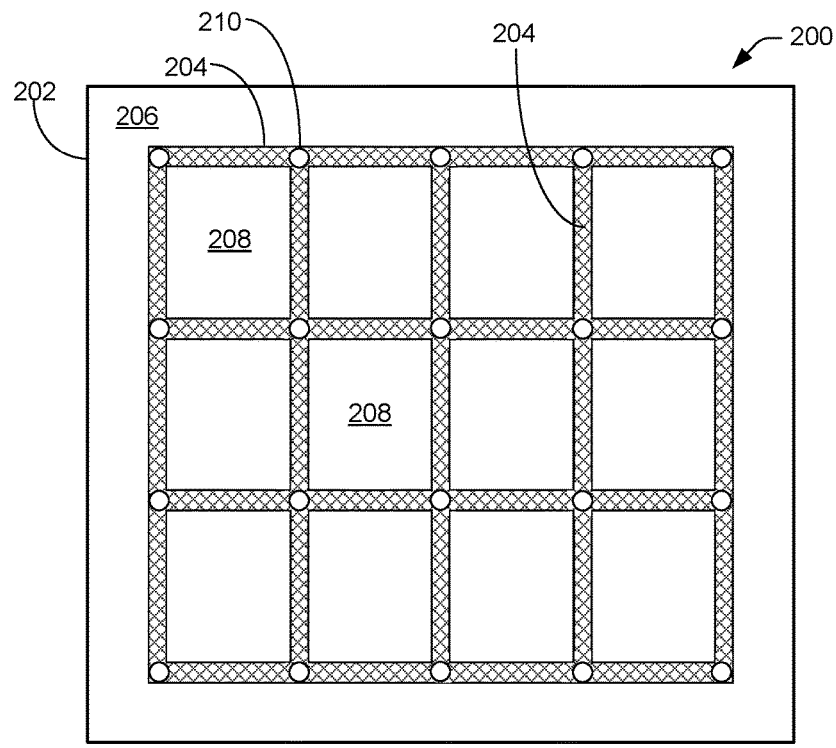
FIG. 2 is a top view of a portion of an electrowetting display device, according to various embodiments.

FIG. 2 is a top view of a portion 200 of an electrowetting display device, according to various embodiments. Pixel walls (not illustrated in FIG. 2), pixel wall extensions, spacers, and a hydrophobic layer are disposed on a first support plate 202. In detail, pixel wall extensions 204 are disposed on pixel walls, which are not visible in the top view of FIG. 2. The pixel walls are disposed on a hydrophobic layer 206 and separate pixel regions 208 from one another. Spacers 210 are disposed on tops of pixel wall extensions 204 at intersections of rows and columns of the pixel walls and pixel wall extensions 204. Though not illustrated, pixel regions may be at least partially filled with a first fluid and a second fluid may cover hydrophobic layer 206, the pixel walls, pixel wall extensions 204, the oil, and may surround spacers 210. A second support plate, such as second support plate 118 illustrated in FIG. 1, may cover portion 200 and enclose the first and second fluids.

Figure 3:
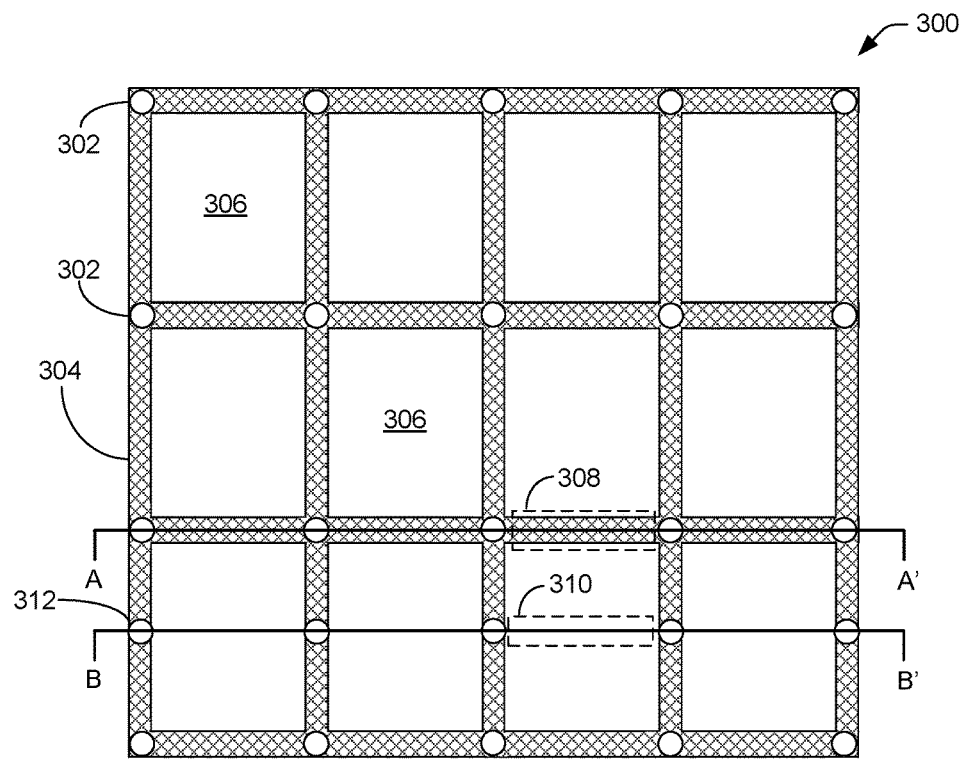
FIG. 3 is a top view of a portion of a grid film, according to various embodiments.

FIG. 3 is a top view of a portion of a grid film 300, according to various embodiments. Such a grid film may be a stand-alone structure that can be placed on (e.g., adhered to or supported by) tops of pixel walls on a first support plate. In another implementation, such a grid film may be a stand-alone structure that can be placed on a second support plate resulting in a composite structure that may subsequently be placed on (e.g., adhered to or supported by) tops of pixel walls on a first support plate. Such assembly implementations are described in detail below.

Grid film 300 includes spacers 302 disposed on pixel wall extension 304 that partition an array of apertures 306. For illustrative purposes, regions 308 and 310 are illustrated. Region 308 includes a portion of pixel wall extension 304 between adjacent spacers 302. Region 310 includes a portion of one aperture 306. A section line A-A' is drawn through region 308 and a section line B-B' is drawn through region 310. These section lines are described below.

In some embodiments, spacers 302 may be located at intersections of pixel wall extension 304. Alternatively, or in addition, spacers, such as spacers 312, may be located anywhere midway between intersections of pixel wall extension 304. Any number (e.g., zero and up) of spacers may be located between intersections of pixel wall extension 304. Moreover, spacers 302 may be located at alternate (e.g., every other one of) intersections of pixel wall extension 304 and, similarly, spacers 312 may be located on alternate (e.g., every other one of) rows or columns of pixel wall extension 304.

In some implementations, spacers 302 and/or pixel wall extensions 304 may comprise an epoxy material or other substantially rigid material. Spacers 302 and/or pixel wall extensions 304 need not comprise the same material. In some implementations, spacers 302 and pixel wall extensions 304 may be fabricated in separate processes and subsequently assembled together. In other implementations, spacers 302 and pixel wall extensions 304 may be fabricated together as a single structure. For example, spacers 302 and pixel wall extensions 304 may be formed on a temporary substrate used for support while forming the spacers and the pixel wall extension. Subsequent to formation of the spacers and the pixel wall extension, the substrate may be remove or dissolved, leaving a grid structure comprising the spacers and the pixel wall extension.

Though the shapes of spacers 302 (and 312) are depicted as being cylindrical (e.g., having a circular cross-section), spacers 302 (and 312) may have a cross-section of any shape, such as square, oval, triangular, an L-shape, an I-shape, and a cross, just to name a few examples.

Figure 4:
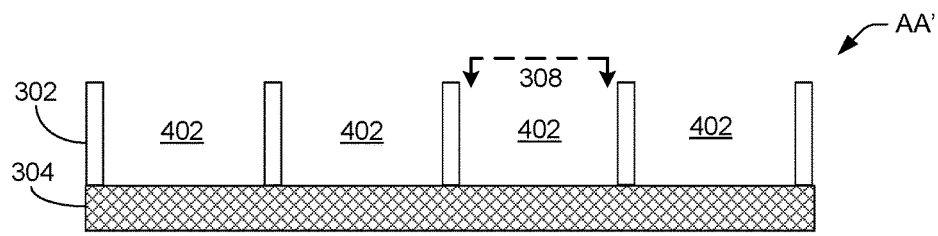
FIGS. 4-5 are cross-sectional views of a portion of a grid film, according to various embodiments.
Figure 5:
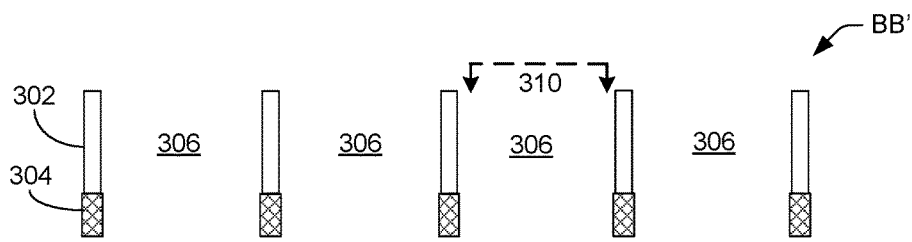

FIGS. 4-5 are cross-sectional views of a portion of grid film 300, according to various embodiments. In particular, FIG. 4 is a cross-sectional view of grid film 300 along section line A-A', and FIG. 5 is a cross-sectional view of grid film 300 along section line B-B'. Region 308 is illustrated in FIG. 4 and coincides with a region 402 that is above a portion of pixel wall extension 304 and between spacers 302. Region 310 is illustrated in FIG. 5 and coincides with a portion of an aperture 306 that is between spacers 302.

Figure 6:
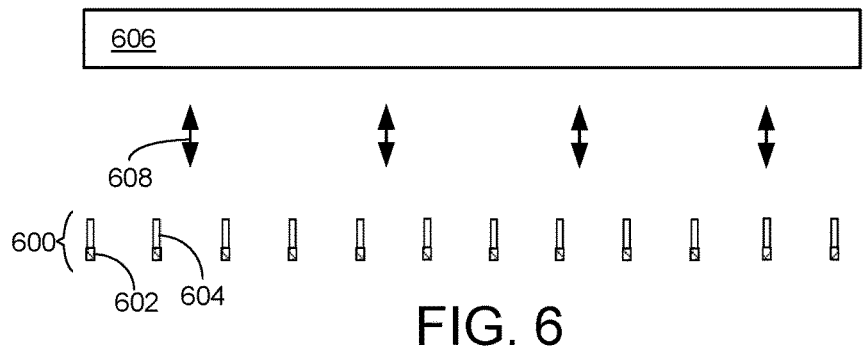
FIGS. 6-8 illustrate portions of a process for fabricating an electrowetting display, according to some embodiments.
Figure 7:
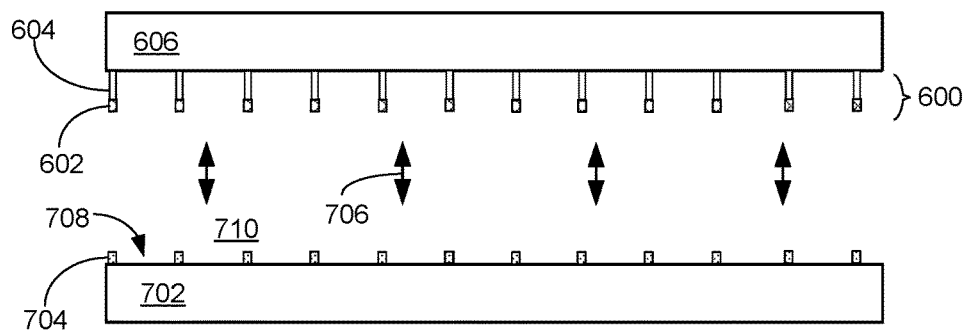
Figure 8:
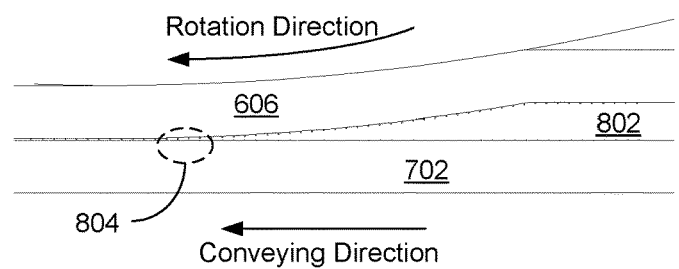

FIGS. 6-8 illustrate portions of a process for fabricating an electrowetting display, according to some embodiments. In FIG. 6, a grid film 600 comprises a pixel wall extension 602 and spacers 604. As mentioned above, grid film 600 may be a stand-alone structure, such as a film or sheet, which can be placed on, or adhered to, another structure, such as a second support plate 606. Arrows 608 depict a process of joining grid film 600 and second support plate 606 together. Though not illustrated, in another embodiment, grid film 600 may be joined to tops of pixel walls disposed on a first support plate, for example. In the former embodiment, illustrated in FIG. 6, grid film 600 may be joined with second support plate 606 using an adhesive, for example.

FIG. 7 illustrates a fabrication process where a structure comprising grid film 600 adhered to second support plate 606 is joined with a first support plate 702 and pixel walls 704 disposed thereon. This process is depicted by arrows 706. In some implementations, regions 708 between pixel walls 704 may be filled with a first fluid. Further, the second fluid may occupy a region 710 to cover first support plate 702, the first fluid, and pixel walls 704. Subsequent to placement of the first and second fluids, the structure including second support plate 606 and grid film 600 may be joined with first support plate 702 and pixel walls 704. Such joining may involve an alignment process where pixel wall extensions 602 are aligned with pixel walls 704 so that the pixel wall extensions are placed on tops of the pixel walls.

FIG. 8 illustrates a process of joining second support plate 606 (having grid film 600 adhered thereon) to first support plate 702 (having pixel walls disposed thereon), according to some example embodiments. Rollers or other mechanical devices (not illustrated) may be used to bring second support plate 606 and first support plate 702 together, which are indicated to be moving toward the left of the figure. An adhesive 802 may be used to laminate second support plate 606 and first support plate 702 together at edges of the display, for example. Excess adhesive 802 and/or excess electrolyte solution may be squeezed out as second support plate 606 and first support plate 702 are laminated together at a region 804, for example. In an alternate embodiment, such a joining process may be used to join second support plate 606, first support plate 702, and stand-alone grid film 600. In other words, grid film 600 need not first be joined to either second support plate 606 or first support plate 702 before the process of joining depicted in FIG. 8.

Figure 9:
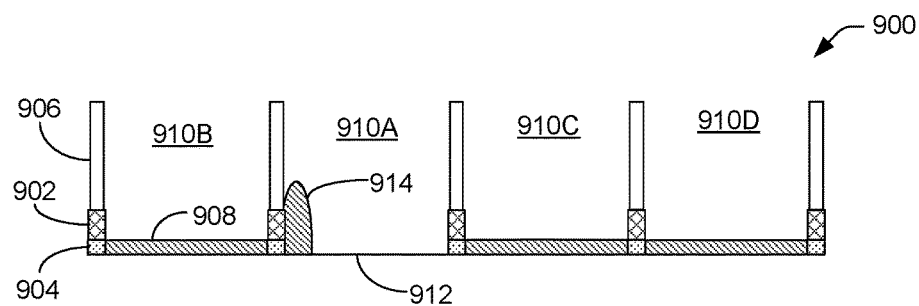
FIG. 9 is a cross-sectional view of a portion of an electrowetting display, according to various embodiments.

FIG. 9 is a cross-sectional view of a portion 900 of an electrowetting display that includes pixel wall extensions 902 disposed on pixel walls 904, according to various embodiments. Spacers 906 are disposed on portions of pixel wall extensions 902. For sake of clarity, elements and layers on the first support plate below the bottom of first fluid 908, and the first support plate itself, are not illustrated in FIG. 9. Four pixel regions are illustrated in the figure, of which one pixel region 910A is in an active state and three pixels regions 910B-910D are in an inactive state. A surface 912 may comprise a top of a hydrophobic layer, for example.

As described above for some embodiments, pixel wall extensions 902 may be formed on spacers 906 that are disposed on a second support plate (not illustrated in FIG. 9). Pixel wall extensions 902 joined to tops of pixel walls 904 add to the height of the pixel walls disposed on the first support plate. The resulting extra wall height may help prevent first fluid from "spilling" over pixel walls from one pixel region to an adjacent pixel region. Such spilling may occur if a pixel is operated with a driving voltage that is relatively large. For example, in the active pixel region 910A, first fluid 914 may be displaced "tightly" against pixel walls 904 and pixel wall extensions 902 toward an edge of the pixel region. Because forces inducing such displacement are primarily in a horizontal (e.g. parallel with the support plates) direction, the displaced oil tends to be squeezed in an upward direction along the pixel walls resulting in a relatively tall bead of first fluid 914. This may be compared to first fluid 908 in an inactive pixel region 910B, for example. Such a tall bead of first fluid may overflow the pixel walls. Adding pixel wall extensions 902 to increase the overall height of the pixel walls may prevent such overflow, thus allowing pixels to be operated at relatively large driving voltages, which can improve brightness and contrast ratio of an electrowetting display that includes such pixels.

Figure 10:
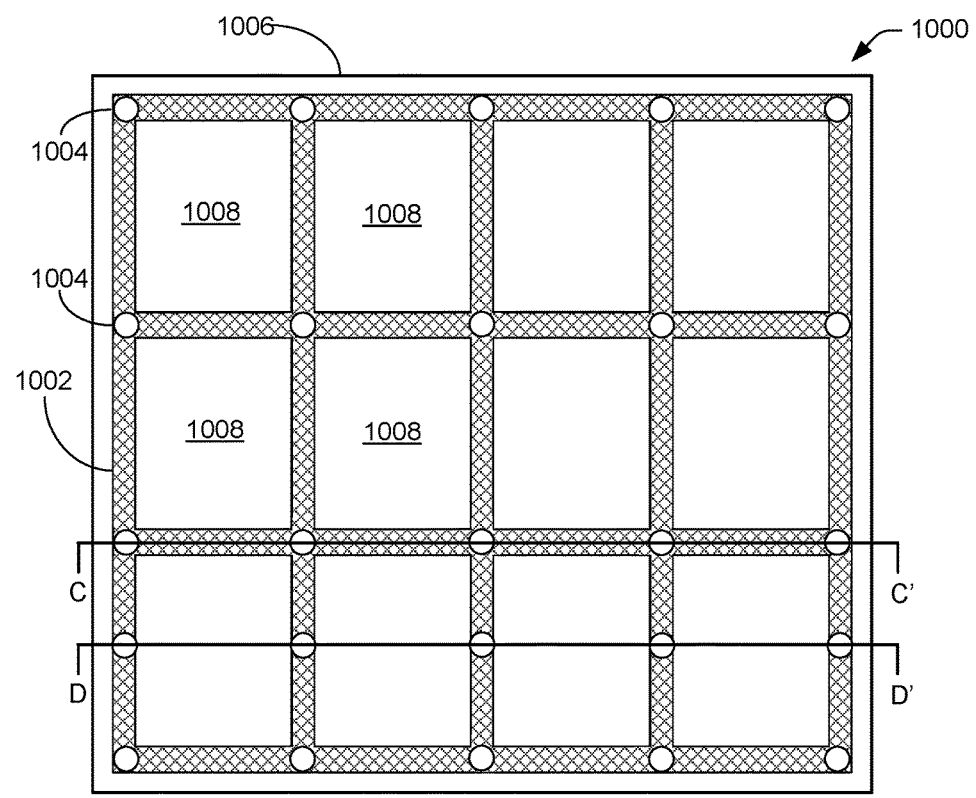
FIG. 10 is a top view of a portion of a structure including pixel wall extensions and spacers disposed on a support plate, according to various embodiments.

FIG. 10 is a top view of a portion of a structure 1000 including pixel wall extensions 1002 and spacers 1004 disposed on a second support plate 1006, according to various embodiments. Structure 1000 is different from embodiments involving a grid film, such as grid film 600, for example, which is a stand-alone structure that need not include a second support plate. On the other hand, structure 1000 comprises a second support plate having pixel wall extensions 1002 and spacers 1004 formed between the pixel wall extensions and the second support plate. Pixel wall extensions 1002 partition or delineate an array of apertures or pixel regions 1008. A section line C-C' is drawn through a portion of structure 1000 and a section line D-D' is drawn through another portion of structure 1000. These section lines are described below.

Figure 11:
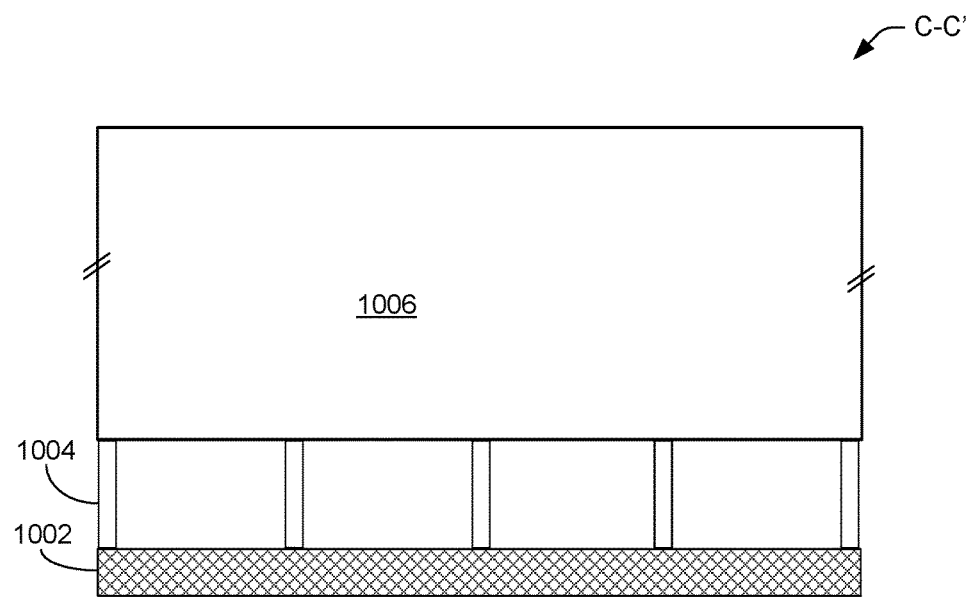
FIGS. 11-12 are cross-sectional views of a portion of a structure including pixel wall extensions and spacers disposed on a support plate, according to various embodiments.
Figure 12:
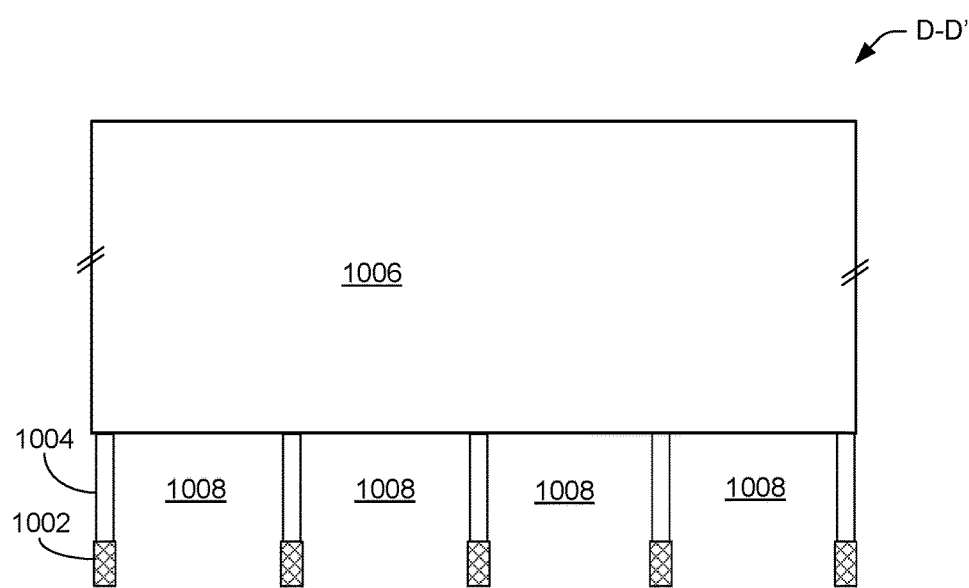

FIG. 11 is a cross-sectional view of a portion of structure 1000 along section line C-C', and includes pixel wall extensions 1002 and spacers 1004 disposed on second support plate 1006, according to various embodiments. FIG. 12 is a cross-sectional view of another portion of structure 1000 along section line D-D', and includes pixel wall extensions 1002 and spacers 1004 disposed on second support plate 1006, according to various embodiments. Pixel wall extensions 1002 partition apertures of an array of pixel regions 1008.

Figure 13:
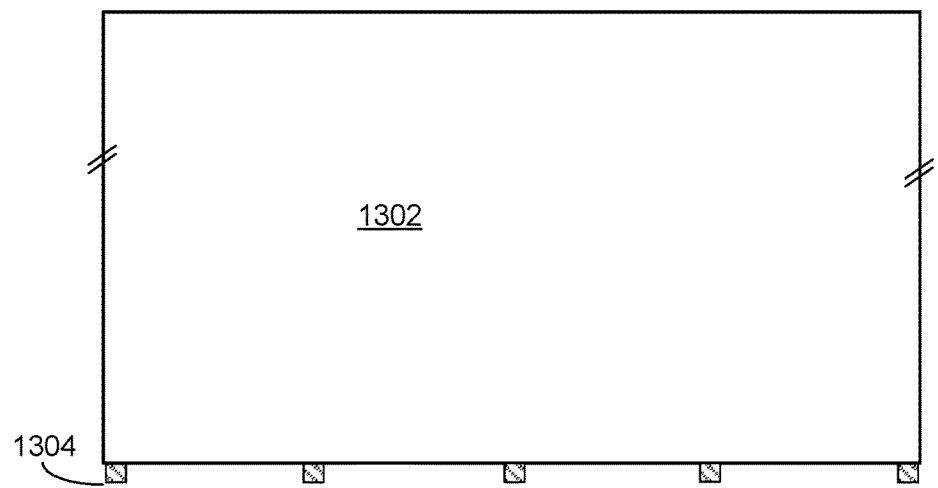
FIGS. 13-16 illustrate portions of a process for fabricating a structure including pixel wall extensions and spacers disposed on a support plate, according to some embodiments.

FIGS. 13-16 illustrate portions of a process for fabricating a structure, such as structure 1000, including pixel wall extensions and spacers disposed on a second support plate, according to some embodiments. In FIG. 13, a second support plate 1302 may comprise glass, plastic, or other transparent material. Spacers of a structure resulting from the following process are fabricated from the same material as that of second support plate 1302. An etch mask 1304 is placed on a surface of second support plate 1302. Such an etch mask may be used for photolithography processes, for example.

Figure 14:
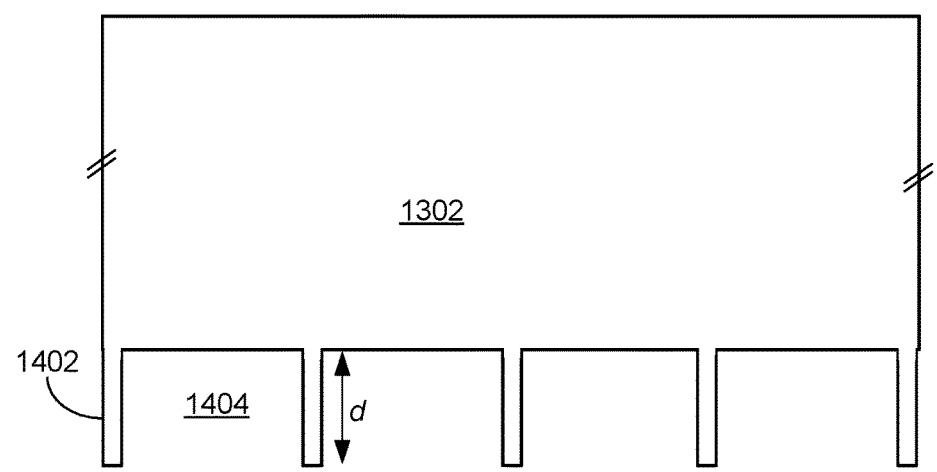

In FIG. 14, portions of second support plate 1302 exposed by etch mask 1304 may be etched by a depth d that will be the length of resulting spacers 1402. For example, spacers may have a length d of about 25 micrometers. Etch mask 1304 may be removed subsequent to the etching. Regions 1404 among spacers 1402 will be filled with a material to form pixel wall extensions, as illustrated below.

Figure 15:
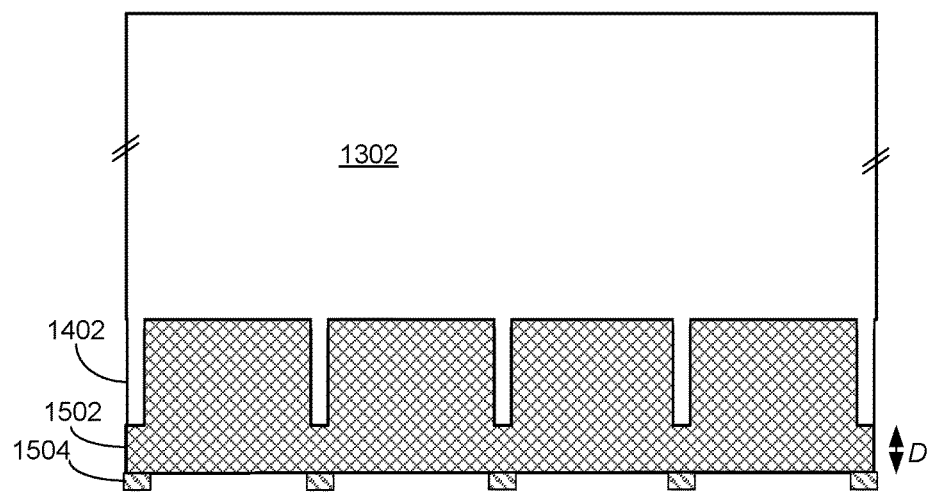

In FIG. 15, a material 1502, such as a photoresist material, may be deposited onto second support plate 1302 so as to fill regions 1404 (illustrated in FIG. 14) and to cover tops of spacers 1402 to a depth D above the tops of the spacers. D will be the height of pixel wall extensions. For example, pixel wall extensions may have a length D of about 4 micrometers. For example, a photoresist material may comprise an epoxy-based negative photoresist SU-8. Techniques for depositing material 1502 may include wet coating techniques like, for example, spin coating or slit coating. An etch mask 1504 is placed on a top surface of material 1502. Such an etch mask may be used for photolithography processes, for example. Regions of material 1502 not covered by etch mask 1504 may be exposed to electromagnetic radiation, which may change the physical properties of material 1502. For example, portions of material 1502 exposed to electromagnetic radiation may be etched or dissolved by a particular process, whereas portions of material 1502 not exposed to the electromagnetic radiation may be resistant to etching or dissolution by the particular process. Etch mask 1504 may comprise a black matrix (e.g., black photo-sensitive material) having substantially zero light and UV transmission.

Figure 16:
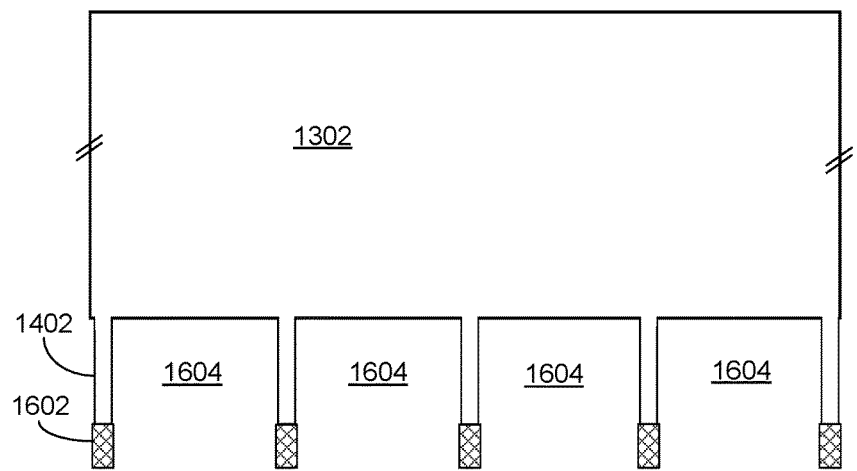

In FIG. 16, portions of material 1502 exposed by etch mask 1504 may be etched to the surface of second support plate 1302 between spacers 1402. Etch mask 1504 may be removed subsequent to the etching. Portions of material 1502 that remain subsequent to the etching comprise a pixel wall extension layer 1602. Some portions of material 1502 are etched from below portions of pixel wall extension layer 1602 (e.g., under-etched) so that pixel wall extension layer 1602 includes self-supporting "bridges" spanning among spacers 1402. Such bridges are not visible in the cross-section view of FIG. 16. Apertures 1604 coincide with pixel regions that are formed after the structure illustrated in FIG. 16 is joined with a first support plate having pixel walls disposed thereon.

Figure 17:
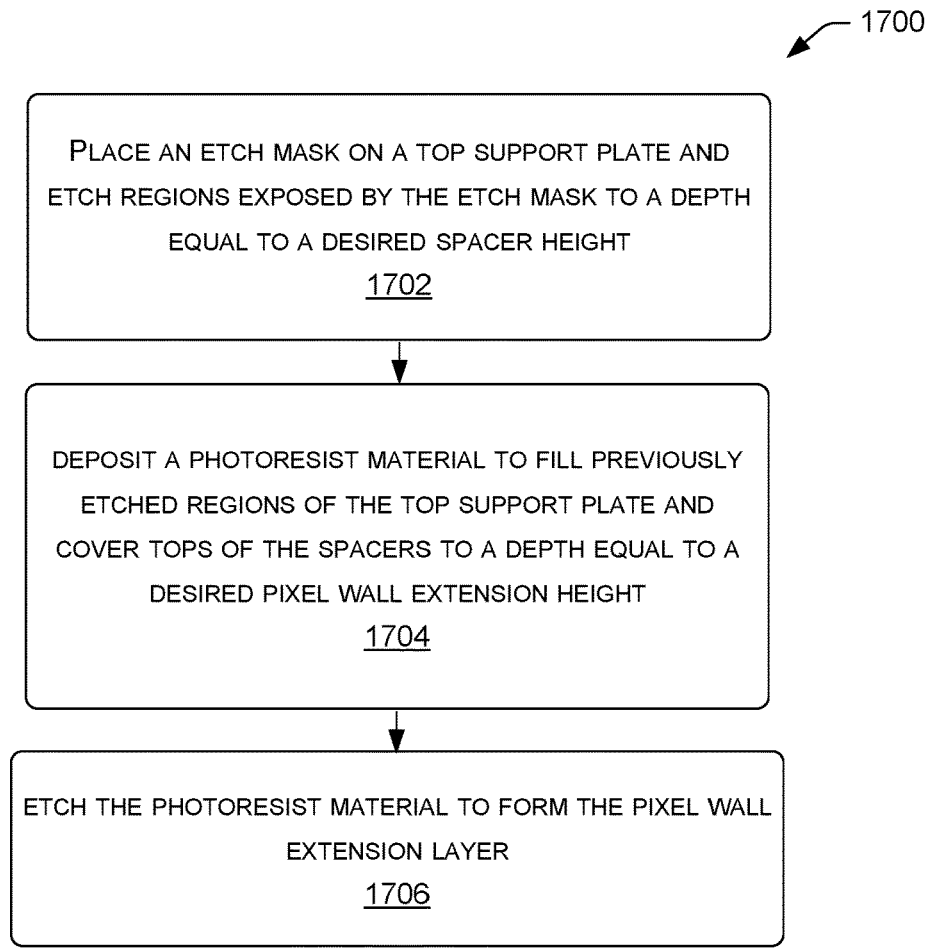
FIG. 17 is a flow diagram of a process for fabricating a structure including pixel wall extensions and spacers disposed on a support plate, according to various example embodiments.
Figure 18:
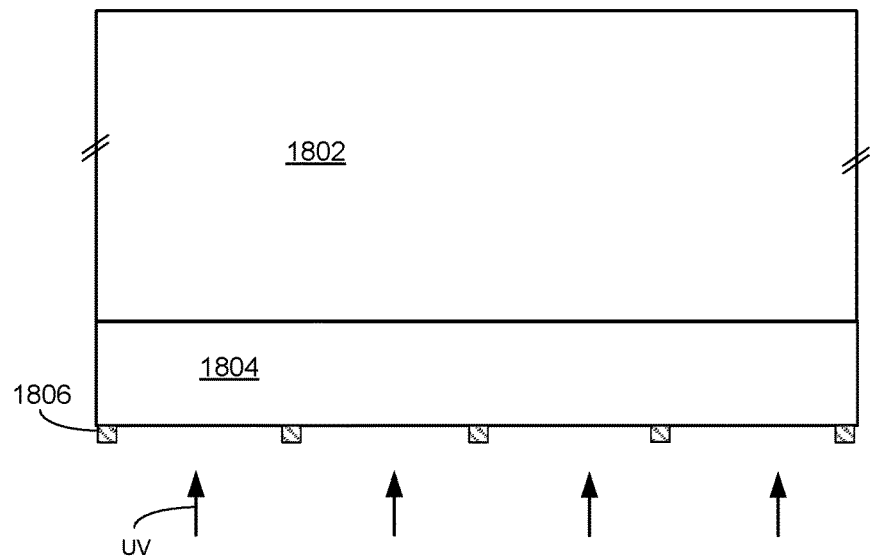
FIGS. 18-21 illustrate portions of a process for fabricating a structure including pixel wall extensions and spacers disposed on a support plate, according to some embodiments.

FIG. 17 is a flow diagram of a process 1700 for fabricating a structure including pixel wall extensions and spacers disposed on a second support plate, according to various example embodiments. Such a process may be similar to or the same as the process depicted in FIGS. 13-16, for example. At block 1702, an etch mask may be placed on a second support plate. Regions exposed by the etch mask may be etched to a depth equal to a desired spacer height, for example. At block 1704, a material, such as a photoresist material, may be deposited to fill previously etched regions of the second support plate and to cover tops of the spacers to a depth equal to a desired pixel wall extension height. At block 1706, the photoresist material may be etched to form the pixel wall extension layer, such as 1602 illustrated in FIG. 16, for example.

FIGS. 18-21 illustrate portions of a process for fabricating a structure, such as structure 1000, including pixel wall extensions and spacers disposed on a second support plate 1802, according to some embodiments. In contrast to the fabrication process 1700, spacers of a structure resulting from the following process need not be fabricated from the same material as that of second support plate 1802.

A spacer material 1804 may be deposited on second support plate 1802. Such material may comprise, for example, a photoresist material, plastic, or an epoxy material, just to name a few examples. For example, a spacer material may comprise an epoxy-based negative photoresist SU-8. An etch mask 1806 may be placed on a surface of spacer material 1804. Such an etch mask may be used for photolithography processes, for example. Regions of spacer material 1804 not covered by etch mask 1806 may be exposed to electromagnetic radiation, which may change the physical properties of spacer material 1804. For example, portions of spacer material 1804 exposed to electromagnetic radiation may be etched or dissolved by a particular process, whereas portions of spacer material 1804 not exposed to the electromagnetic radiation may be resistant to etching or dissolution by the particular process. Etch mask 1806 may comprise a black matrix (e.g., black photo-sensitive material) having substantially zero light and UV transmission.

Figure 19:
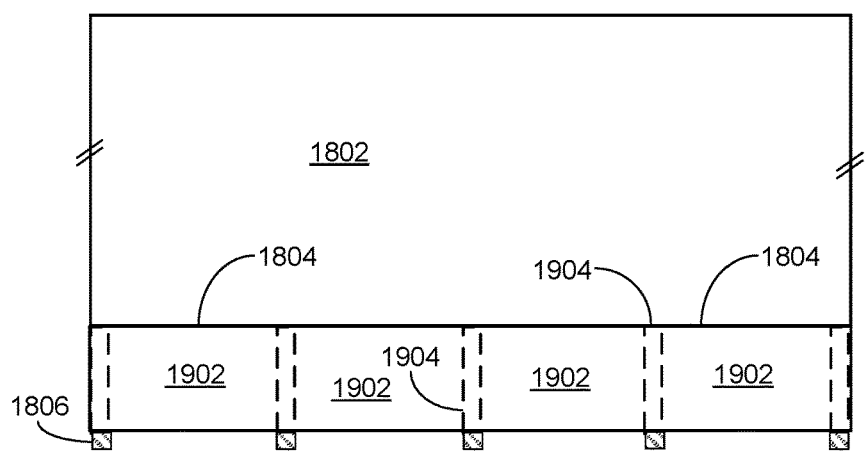

FIG. 19 illustrates portions 1902 of spacer material 1804 exposed to electromagnetic radiation and portions 1904 of spacer material 1804 not exposed to the electromagnetic radiation. Accordingly, as explained above, portions 1902 of spacer material 1804 exposed to electromagnetic radiation may be etched or dissolved by a particular process, whereas portions 1904 of spacer material 1804 not exposed to the electromagnetic radiation may be resistant to etching or dissolution by the particular process.

Figure 20:
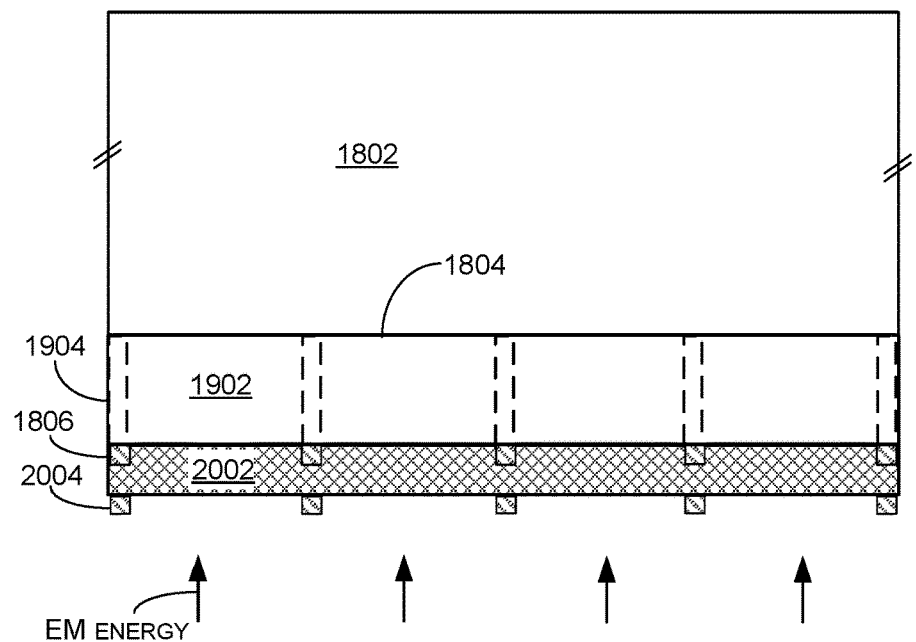

In FIG. 20, a pixel wall extension material 2002 may be deposited on spacer material 1804 and an etch mask 1806. Such material may comprise, for example, a photoresist material, plastic, or an epoxy material, just to name a few examples. Techniques for depositing pixel wall extension material 2002 may include, for example, wet coating techniques like slit coating or spin coating processes. In some implementations, a thickness of spacer material 1804 is greater than a thickness of pixel wall extension material 2002. An etch mask 2004 may be placed on a surface of pixel wall extension material 2002. Such an etch mask may be used for photolithography processes, for example. Regions of pixel wall extension material 2002 not covered by etch mask 2004 may be exposed to electromagnetic radiation, which may change the physical properties of pixel wall extension material 2002. For example, portions of pixel wall extension material 2002 exposed to electromagnetic radiation may be etched or dissolved by a particular process, whereas portions of pixel wall extension material 2002 not exposed to the electromagnetic radiation may be resistant to etching or dissolution by the particular process.

Figure 21:
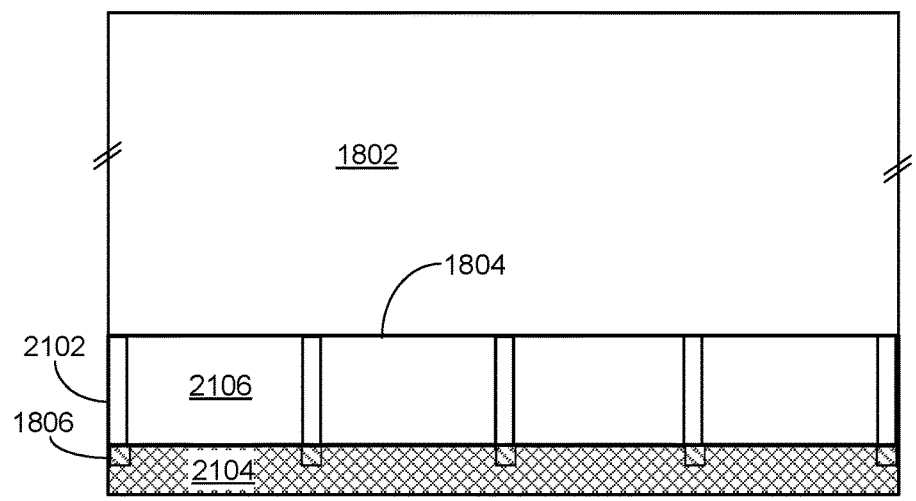

FIG. 21 illustrates a cross-sectional view of a portion of the structure in FIG. 20 subsequent to an etching process where both spacer material 1804 and pixel wall extension material 2002 are etched to the surface of second support plate 1802 between areas of non-exposed spacer material 1904. The cross-sectional view is taken along cross-section C-C', illustrated in FIG. 10. An etching process may be a single etching process that etches and removes both the exposed spacer material and the exposed pixel wall extension material. During the etching process, the exposed spacer material 1902 is etched away, leaving non-exposed spacer material 1904 to remain and form spacers 2102. Etch mask 2004 may also be removed, though etch mask 1806 may remain.

Portions of material 2002 that remain subsequent to the etching comprise a pixel wall extension layer 2104. Some portions of exposed spacer material 1902 are etched from below portions of pixel wall extension material 2002 (e.g., under-etched) so that pixel wall extension layer 2104 includes self-supporting "bridges" spanning between and among spacers 2102. Apertures 2106 coincide with pixel regions that are formed after the structure illustrated in FIG. 21 is joined with a first support plate having pixel walls disposed thereon.

Figure 22:
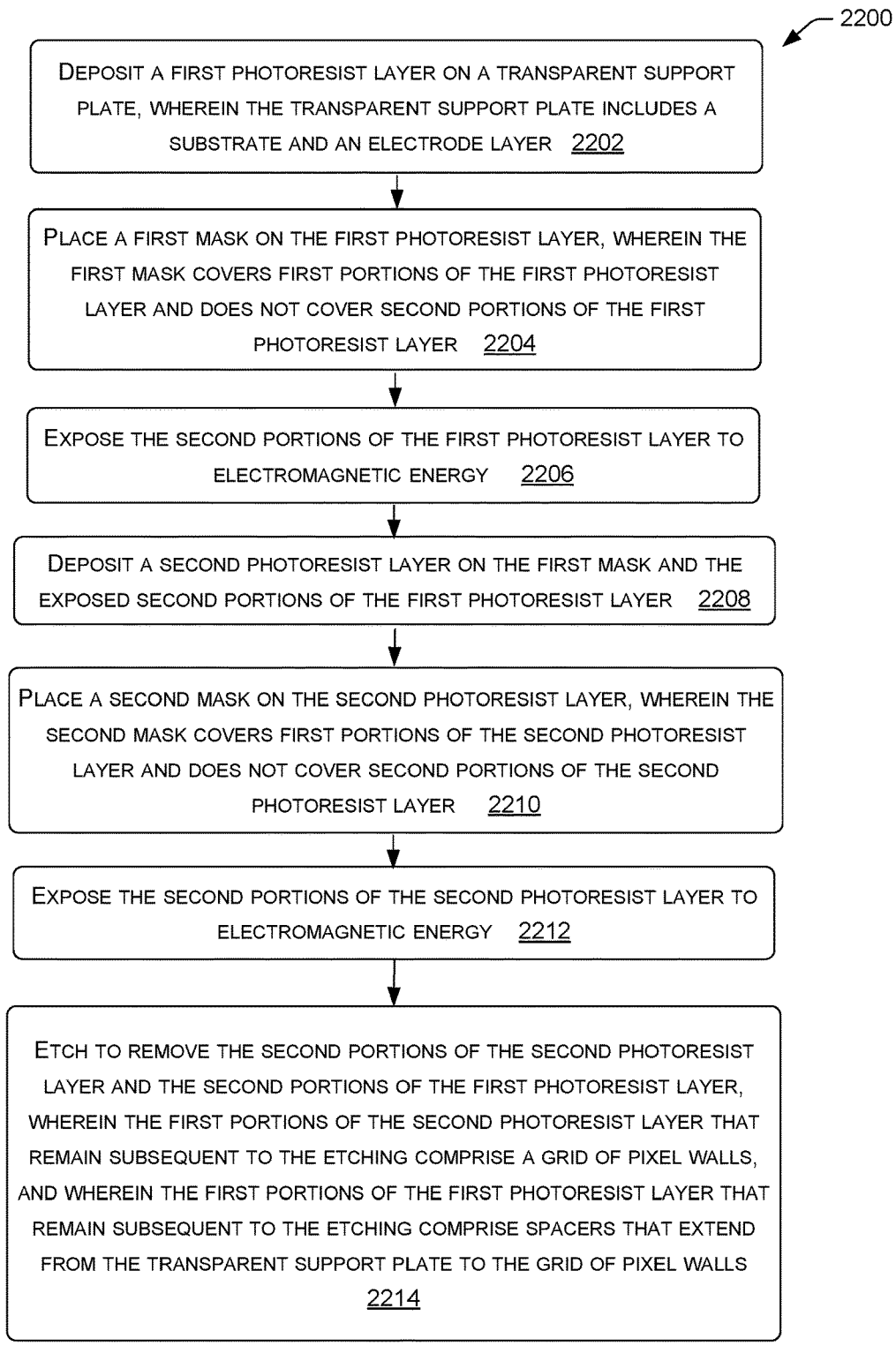
FIG. 22 is a flow diagram of a process for fabricating a structure including pixel wall extensions and spacers disposed on a support plate, according to various example embodiments.

FIG. 22 is a flow diagram of a process 2200 for fabricating a structure including pixel wall extensions and spacers disposed on a second support plate, according to various example embodiments. For example, such a structure may be similar to or the same as structure 1000, illustrated in FIGS. 10-12.

At block 2202 a first photoresist layer may be deposited on a support plate, such as second support plate 1006, illustrated in FIG. 10. For example, the first photoresist material may comprise an epoxy-based negative photoresist SU-8. The transparent support plate may include a substrate, such as glass, plastic, or an epoxy, for example, and an electrode layer, such as indium tin oxide. At block 2204, a first mask may be deposited on the first photoresist layer. The first mask may cover first portions of the first photoresist layer while not covering second portions of the first photoresist layer. At block 2206, the second portions of the first photoresist layer may be exposed to electromagnetic radiation, which affects the physical structure of the first photoresist layer so that such-exposed portions of the first photoresist layer may be etched during an etching process that does not etch unexposed portions of the first photoresist layer. At block 2208, a second photoresist layer may be deposited on the first mask and the electromagnetically-exposed second portions of the first photoresist layer. For example, the second photoresist material may comprise an epoxy-based negative photoresist SU-8. At block 2210, a second mask may be deposited on the second photoresist layer. The second mask may cover first portions of the second photoresist layer while not covering second portions of the second photoresist layer. At block 2212, the second portions of the second photoresist layer may be exposed to electromagnetic radiation. At block 2214, the second portions of the second photoresist layer and the second portions of the first photoresist layer may be etched and removed, while the first portions of the second photoresist layer that remain subsequent to the etching comprise a grid of pixel wall (extension)s. The first portions of the first photoresist layer that remain subsequent to the etching comprise spacers that extend from the transparent support plate to the grid of pixel wall extensions.

Figure 23:
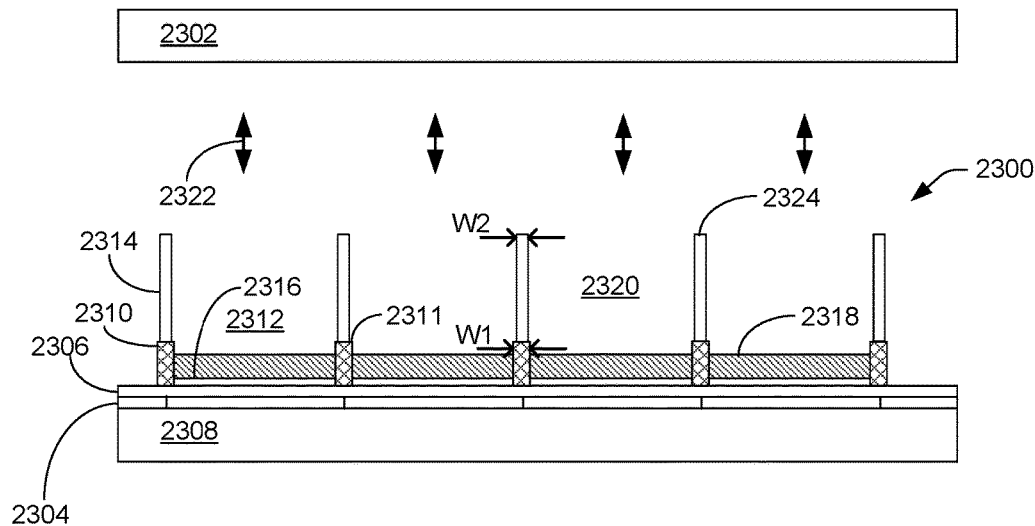
FIG. 23 is a cross-sectional view of a portion of an electrowetting display, according to various embodiments.

FIG. 23 is a cross-sectional view of a bottom structure 2300 of an electrowetting display being joined with a second support plate 2302, according to various embodiments. For example, bottom structure 2300 of the electrowetting display may include an electrode layer 2304 and a dielectric layer 2306 on a first support plate 2308. Pixel walls 2310 may be disposed on barrier layer 2306, where the pixel walls partition a region above the barrier layer into pixel regions 2312. Spacers 2314 may be disposed on tops of pixel walls 2310. A fluoropolymer layer 2316 may at least partially cover the conductive layer and may at least partially cover the tops of pixel walls 2310 and sides of the pixel walls and dielectric layer 2306. Widths W1 of the tops 2311 of pixel walls 2310 may be larger than widths W2 of spacers 2314. In other words, widths W1 may be larger than a contact area between tops 2311 and spacers 2314. In some particular examples, W1 may be in a range from about 6 microns up to about 8 microns and W2 may be in a range from about 2 microns up to about 4 microns, though claimed subject matter is not limited in this respect.

Spacers 2314 fabricated on tops 2311 of pixel walls 2310 may allow for the spacers to have a narrower width than that of the pixel walls. This is in contrast to spacers fabricated on a second support plate (e.g., second support plate 1006) where the spacers are aligned with and joined to tops of pixel walls disposed on a first support plate. Because such alignment may be relatively difficult, spacers fabricated on the second support plate may be intentionally wider than the pixel walls. Unfortunately, the extra width of the spacers extends beyond the widths of the pixel walls and protrudes into the pixel region (aperture of the pixel), adversely affecting the optical performance of the pixel. Accordingly, fabricating spacers 2314 on tops of pixel walls 2310 may involve a self-aligning process where the spacers may be narrower than the pixel walls and be formed in alignment with the pixel walls in a process described below, for example. In some implementations, spacers 2314 may have a length that is more than about three times the height of pixel walls 2310. In such cases, though not necessary, spacers 2314 may be fabricated from a relatively rigid material, such as an epoxy, for example.

Bottom structure 2300 may further comprise a first fluid 2318 disposed on hydrophobic layer 2316 adjacent to dielectric layer 2306 in pixel regions 2312. An second fluid 2320 that is immiscible with the first fluid may cover the first fluid, pixel walls 2310, and surround spacers 2314. Arrows 2322 indicate second support plate 2302 being joined to bottom structure 2300. In particular, second support plate 2302 may be joined to distal ends 2324 of spacers 2314, for example.

Figure 24:
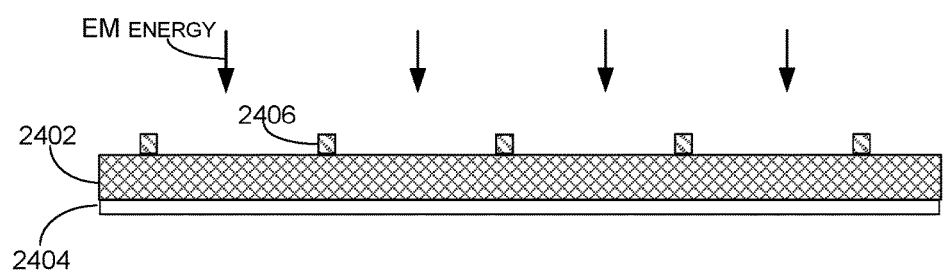
FIGS. 24-29 illustrate portions of a process for fabricating an electrowetting device structure, according to some embodiments.
Figure 25:
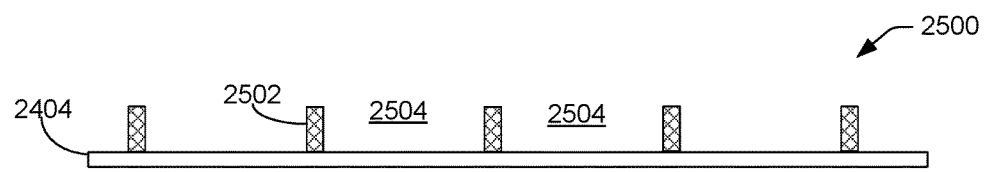

FIGS. 24-29 illustrate portions of a process for fabricating a structure, such as bottom structure 2300, illustrated in FIG. 23, for example, according to some embodiments. A process for forming spacers on pixel walls may avoid a reactive ion etching (RIE) step, which may otherwise be used to temporarily change hydrophobicity of a material on which pixel walls are formed. Because RIE may be avoided, a heating process, used to return to an original hydrophobicity of the material, may also be avoided. For example, in some implementations, a hydrophobic layer may be maintained below a temperature of about 50 degrees centigrade during the depositing of the hydrophobic layer on bottom structure 2300. In FIG. 24, a pixel wall material 2402, such as a photoresist material, may be deposited onto a dielectric layer 2404. For sake of clarity, elements below dielectric layer 2404 are not illustrated. Dielectric layer 2404 may be similar to or the same as dielectric layer 2306, illustrated in FIG. 23, for example. Etch mask 2406 may be placed on a top surface of pixel wall material 2402. Portions of pixel wall material 2402 not masked by etch mask 2406 may be exposed to electromagnetic radiation. In a subsequent process, such exposed portions may be removed by an etching process and a resulting structure 2500 is illustrated in FIG. 25. The etching and removal process may form pixel walls 2502, which are the un-etched portions of pixel wall material 2402. Pixel walls 2502 form an array of rows and columns of walls that partition the top surface of dielectric layer 2404 into pixel regions 2504.

Figure 26:
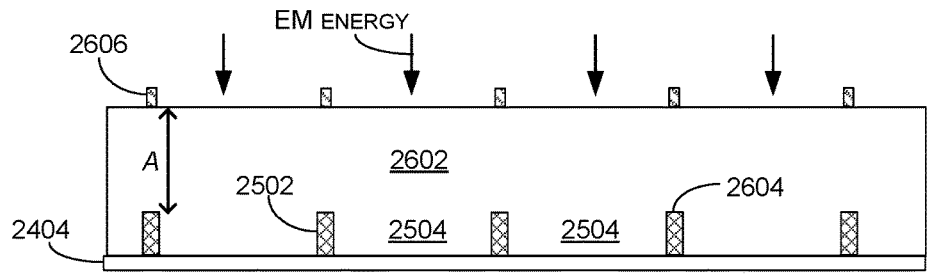
Figure 27:
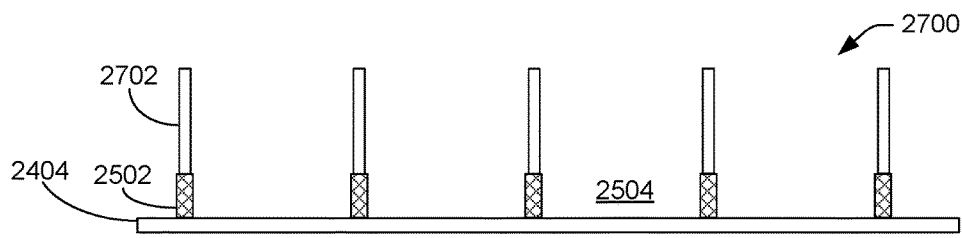

In FIG. 26, a spacer material 2602 is deposited onto dielectric layer 2404 so as to cover pixel walls 2502 and fill pixel regions 2504. For example, the spacer material may comprise an epoxy material or a photoresist material, such as SU-8. Techniques for depositing spacer material 2602 may include, a wet coating process, for example, slit coating or spin coating process. Spacer material 2602 is deposited so as to cover the tops 2604 of pixel walls 2502 to a depth A, which is a desired length of spacers to be subsequently formed. An etch mask 2606 may be placed on a top surface of spacer material 2602. Portions of spacer material 2602 not masked by etch mask 2606 may be exposed to electromagnetic radiation. In a subsequent process, such exposed portions may be removed by an etching process and a resulting structure 2700 is illustrated in FIG. 27. The etching and removal process may form spacers 2702, which are the un-etched portions of spacer material 2602. Spacers 2702 may be disposed on tops 2604 of pixel walls 2502 at intersections of the rows and columns of the pixel walls, for example. The etching and removal process also re-exposes pixel regions 2504.

Figure 28:
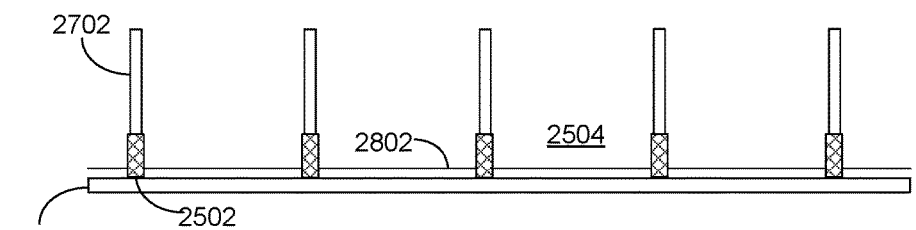
Figure 29:
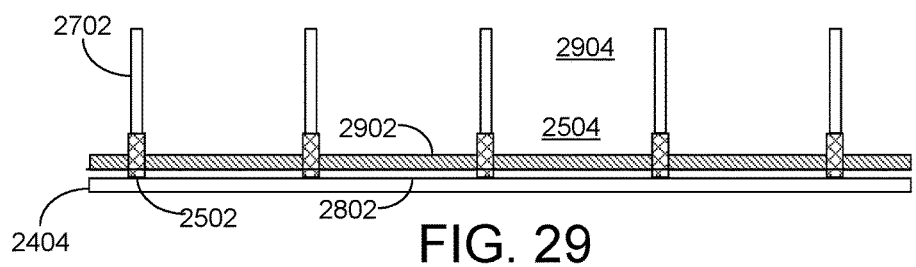

In FIG. 28, a hydrophobic layer 2802 may be deposited to cover dielectric layer 2404 and/or sides of pixel walls 2502 or parts of sides of pixel walls. The hydrophobic layer may be deposited at or below a temperature of about 50 degrees centigrade, for example. In some implementations, hydrophobic layer 2802 may also cover portions of the spacers 2702. Hydrophobic layer 2802 may be similar to or the same as hydrophobic layer 2316, for example. In FIG. 29, a first fluid 2902 may be placed in pixel regions 2504 and covered with second fluid 2904, for example.

Figure 30:
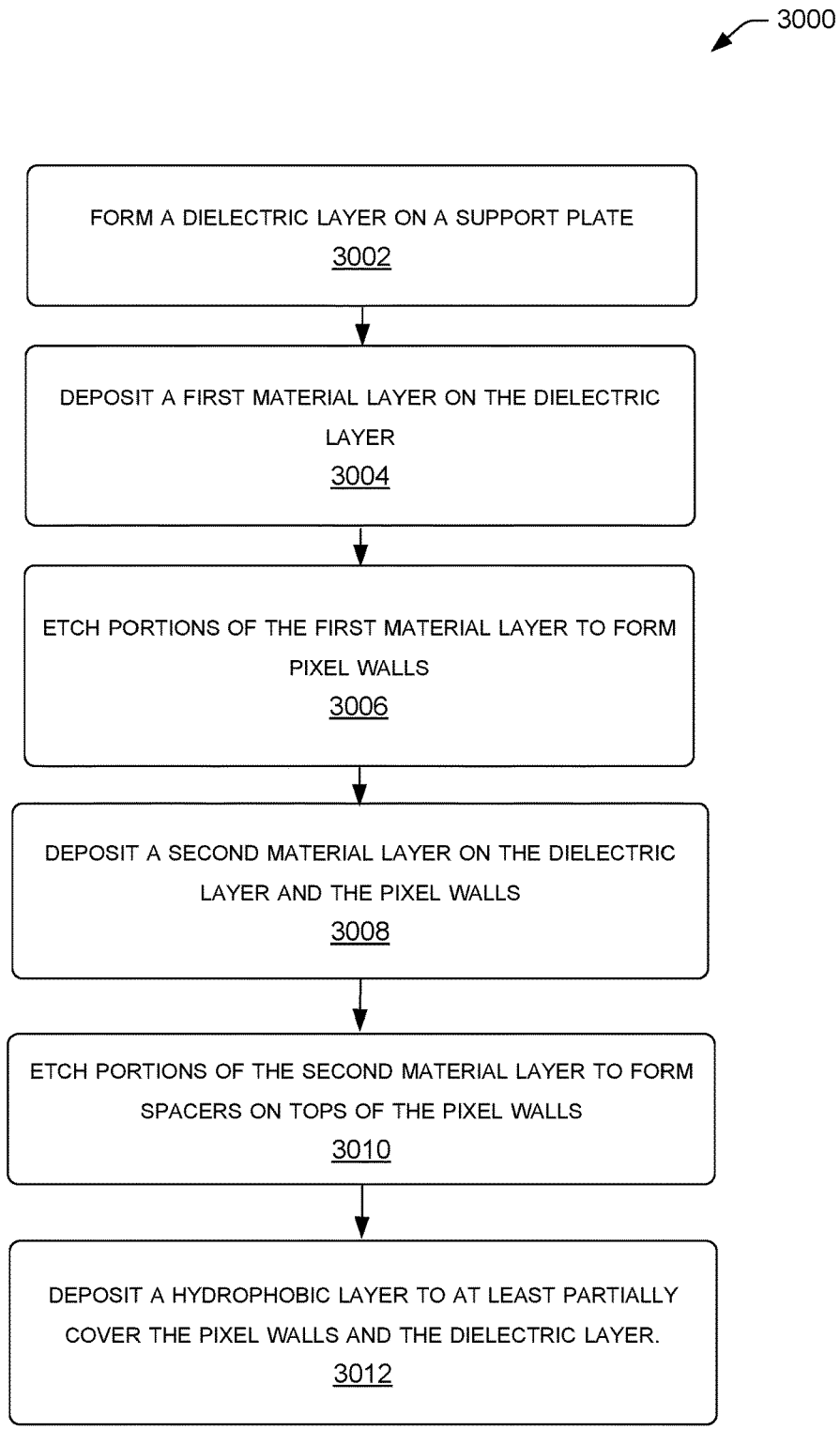
FIG. 30 is a flow diagram of a process for fabricating an electrowetting device structure, according to various example embodiments.

FIG. 30 is a flow diagram of a process 3000 for fabricating a structure that includes spacers formed on pixel walls disposed on a first support plate, according to various example embodiments. For example, process 3000 may be similar to or the same as fabrication processes depicted in FIGS. 24-29. At block 3002, a dielectric layer may be formed on a support plate. For example, the dielectric layer may be deposited on the support plate by chemical vapor deposition (CVD), physical vapor deposition (PVD), molecular beam epitaxy (MBE), sputtering, and so on. At block 3004, a first material layer may be deposited on the dielectric layer by a wet coating process like spin coating or slit coating, for example. The first material may comprise a photoresist material. At block 3006, portions of the first material layer may be etched to form pixel walls. Such etching may involve any of a number of techniques, such as chemical etching, for example. At block 3008, a second material layer may be deposited on the dielectric layer and the pixel walls by a wet coating process like spin coating or slit coating, for example. The second material may comprise a photoresist material. At block 3010, portions of the second material layer may be etched to form spacers on tops of the pixel walls. At block 3012, a hydrophobic layer may be deposited to at least partially cover the pixel walls and the dielectric layer.

Figure 31:
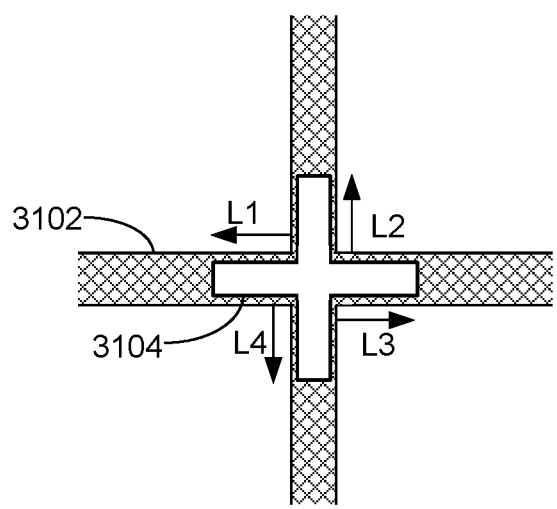
FIG. 31 is a top view of a portion of pixel walls and a spacer, according to various embodiments.

FIG. 31 is a top view of a portion of pixel walls 3102 and a spacer 3104, according to various embodiments. Pixel walls 3102 may be similar to or the same as any of pixel walls 110, 704, 904, 2310, and 2502, for example, described for various embodiments. Spacer 3104 may be similar to or the same as any of spacers 122, 302, 604, 906, 1004, 1402, 2102, and so on. Such spacers, described herein, may have any of a number of possible cross-sectional shapes, such as an L-shape, an X-shape (as illustrated in FIG. 31), an oval, a circle, a diamond, a triangle, and so on. Spacer 3104 may have any combination or ratio of dimensions L1, L2, L3, and L4. For example, L1 and L2 may be equal or unequal, or one of L1 and L2 may be zero, and so on. In another example, all four dimensions L1-L4 may be equal to one another or may be different from one another. In other words, any combinations of lengths L1-L4 are possible. Claimed subject matter is not limited to any particular shape or configuration of spacer.

Figure 32:
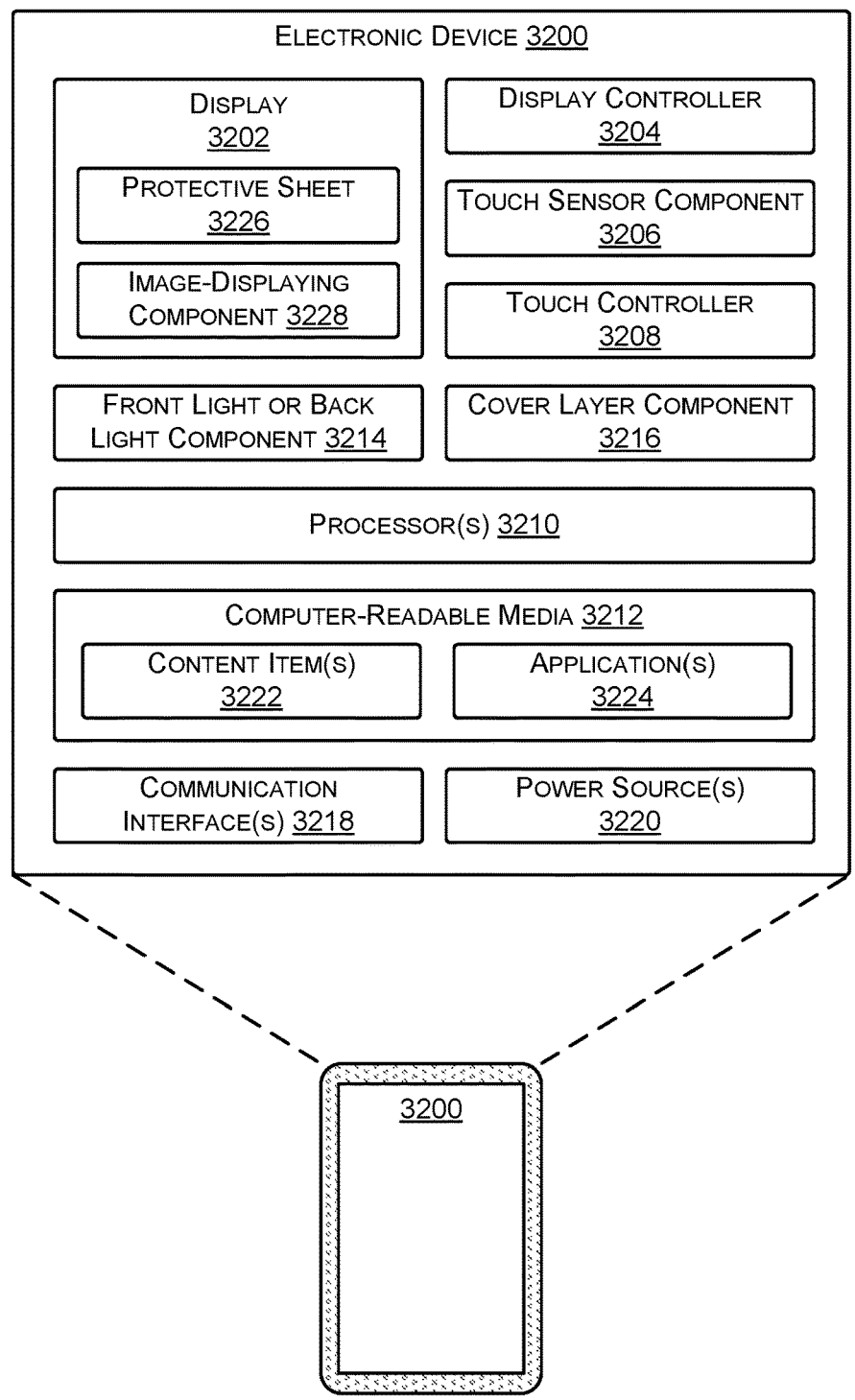
FIG. 32 illustrates an example electronic device that may incorporate a display device, according to some embodiments.

FIG. 32 illustrates an example electronic device 3200 that may incorporate any of the display devices discussed above. The device 3200 may comprise any type of electronic device having a display. For instance, the device 3200 may be a mobile electronic device (e.g., an electronic book reader, a tablet computing device, a laptop computer, a smart phone or other multifunction communication device, a portable digital assistant, a wearable computing device, an automotive display, etc.). Alternatively, the device 3200 may be a non-mobile electronic device (e.g., a computer display, a television, etc.). In addition, while FIG. 32 illustrates several example components of the electronic device 3200, it is to be appreciated that the device 3200 may also include other conventional components, such as an operating system, system busses, input/output components, and the like. Further, in other examples, such as in the case of a television or computer monitor, the electronic device 3200 may only include a subset of the components illustrated.

Regardless of the specific implementation of the electronic device 3200, the device 3200 includes a display 3202 and a corresponding display controller 3204. The display 3202 may represent a reflective, transflective or transmissive display.

In an implementation, the display comprises an electrowetting display that employs an applied voltage to change the surface tension of a fluid in relation to a surface. For example, such an electrowetting display may include the array of pixels 100 illustrated in FIG. 1, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by contracting a colored oil film if a voltage is applied to individual pixels of the display. If the voltage is absent, the colored oil forms a continuous film within a pixel, and the color may thus be visible to a user of the display. On the other hand, if the voltage is applied to the pixel, the colored oil is displaced and the pixel becomes transparent. If multiple pixels of the display are independently activated, the display may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, the display 3202 may represent a backlit display, examples of which are mentioned above.

In addition to including the display 3202, FIG. 32 illustrates that some examples of the device 3200 may include a touch sensor component 3206 and a touch controller 3208. In some instances, at least one touch sensor component 3206 resides with, or is stacked on, the display 3202 to form a touch-sensitive display. Thus, the display 3202 may be capable of both accepting user touch input and rendering content in response to or corresponding to the touch input. As several examples, the touch sensor component 3206 may comprise a capacitive touch sensor, a force sensitive resistance (FSR), an interpolating force sensitive resistance (IFSR) sensor, or any other type of touch sensor. In some instances, the touch sensor component 3206 is capable of detecting touches as well as determining an amount of pressure or force of these touches.

FIG. 32 further illustrates that the electronic device 3200 may include one or more processors 3210 and one or more computer-readable media 3212, as well as a front light component 3214 (which may alternatively be a backlight component in the case of a backlit display) for lighting the display 3202, a cover layer component 3216, such as a cover glass or cover sheet, one or more communication interfaces 3218 and one or more power sources 3220. The communication interfaces 3218 may support both wired and wireless connection to various networks, such as cellular networks, radio, WiFi networks, short range networks (e.g., Bluetooth®), infrared (IR), and so forth.

Depending on the configuration of the electronic device 3200, the computer-readable media 3212 (and other computer-readable media described throughout) is an example of computer storage media and may include volatile and nonvolatile memory. Thus, the computer-readable media 3212 may include, but is not limited to, RAM, ROM, EEPROM, flash memory, or other memory technology, or any other medium that may be used to store computer-readable instructions, programs, applications, media items, and/or data which may be accessed by the electronic device 3200.

The computer-readable media 3212 may be used to store any number of functional components that are executable on the processor 3210, as well as content items 3222 and applications 3224. Thus, the computer-readable media 3212 may include an operating system and a storage database to store one or more content items 3222, such as eBooks, audio books, songs, videos, still images, and the like. The computer-readable media 3212 of the electronic device 3200 may also store one or more content presentation applications to render content items on the device 3200. These content presentation applications may be implemented as various applications 3224 depending upon the content items 3222. For instance, the content presentation application may be an electronic book reader application for rending textual electronic books, an audio player for playing audio books or songs, a video player for playing video, and so forth.

In some instances, the electronic device 3200 may couple to a cover (not illustrated in FIG. 32) to protect the display (and other components in the display stack or display assembly) of the device 3200. In one example, the cover may include a back flap that covers a back portion of the device 3200 and a front flap that covers the display 3202 and the other components in the stack. The device 3200 and/or the cover may include a sensor (e.g., a Hall effect sensor) to detect if the cover is open (i.e., if the front flap is not atop the display and other components). The sensor may send a signal to the front light component 3214 if the cover is open and, in response, the front light component 3214 may illuminate the display 3202. If the cover is closed, meanwhile, the front light component 3214 may receive a signal indicating that the cover has closed and, in response, the front light component 3214 may turn off.

Furthermore, the amount of light emitted by the front light component 3214 may vary. For instance, upon a user opening the cover, the light from the front light may gradually increase to its full illumination. In some instances, the device 3200 includes an ambient light sensor (not illustrated in FIG. 32) and the amount of illumination of the front light component 3214 may be based at least in part on the amount of ambient light detected by the ambient light sensor. For example, the front light component 3214 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of the display 3202 may vary depending on whether the front light component 3214 is on or off, or based on the amount of light provided by the front light component 3214. For instance, the electronic device 3200 may implement a larger default font or a greater contrast if the light is off compared to if the light is on. In some instances, the electronic device 3200 maintains, if the light is on, a contrast ratio for the display that is within a certain defined percentage of the contrast ratio if the light is off.

As described above, the touch sensor component 3206 may comprise a capacitive touch sensor that resides atop the display 3202. In some examples, the touch sensor component 3206 may be formed on or integrated with the cover layer component 3216. In other examples, the touch sensor component 3206 may be a separate component in the stack of the display assembly. The front light component 3214 may reside atop or below the touch sensor component 3206. In some instances, either the touch sensor component 3206 or the front light component 3214 is coupled to a top surface of a protective sheet 3226 of the display 3202. As one example, the front light component 3214 may include a lightguide sheet and a light source (not illustrated in FIG. 32). The lightguide sheet may comprise a substrate (e.g., a transparent thermoplastic such as PMMA or other acrylic), a layer of lacquer and multiple grating elements formed in the layer of lacquer that function to propagate light from the light source towards the display 3202, thus illuminating the display 3202.

The cover layer component 3216 may include a transparent substrate or sheet having an outer layer that functions to reduce at least one of glare or reflection of ambient light incident on the electronic device 3200. In some instances, the cover layer component 3216 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, the protective sheet 3226 may include a similar UV-cured hard coating on the outer surface. The cover layer component 3216 may couple to another component or to the protective sheet 3226 of the display 3202. The cover layer component 3216 may, in some instances, also include a UV filter, a UV-absorbing dye, or the like, for protecting components lower in the stack from UV light incident on the electronic device 3200. In still other examples, the cover layer component 3216 may include a sheet of high-strength glass having an antiglare and/or antireflective coating.

The display 3202 includes the protective sheet 3226 overlying an image-displaying component 3228. For example, the display 3202 may be preassembled to have the protective sheet 3226 as an outer surface on the upper or image-viewing side of the display 3202. Accordingly, the protective sheet 3226 may be integral with and may overlie the image-displaying component 3228. The protective sheet 3226 may be optically transparent to enable a user to view, through the protective sheet 3226, an image presented on the image-displaying component 3228 of the display 3202.

In some examples, the protective sheet 3226 may be a transparent polymer film in the range of 25 to 200 micrometers in thickness. As several examples, the protective sheet may be a transparent polyester, such as polyethylene terephthalate (PET) or polyethylene naphthalate (PEN), or other suitable transparent polymer film or sheet, such as a polycarbonate or an acrylic. In some examples, the outer surface of the protective sheet 3226 may include a coating, such as the hard coating described above. For instance, the hard coating may be applied to the outer surface of the protective sheet 3226 before or after assembly of the protective sheet 3226 with the image-displaying component 3228 of the display 3202. In some examples, the hard coating may include a photoinitiator or other reactive species in its composition, such as for curing the hard coating on the protective sheet 3226. Furthermore, in some examples, the protective sheet 3226 may be dyed with a UV-light-absorbing dye, or may be treated with other UV-absorbing treatment. For example, the protective sheet may be treated to have a specified UV cutoff such that UV light below a cutoff or threshold wavelength is at least partially absorbed by the protective sheet 3226, thereby protecting the image-displaying component 3228 from UV light.

According to some implementations herein, one or more of the components discussed above may be coupled to the display 3202 using fluid optically-clear adhesive (LOCA). For example, suppose that the light guide portion of the front light component 3214 is to be coupled to the display 3202. The light guide may be coupled to the display 3202 by placing the LOCA on the outer or upper surface of the protective sheet 3226. If the LOCA reaches the corner(s) and/or at least a portion of the perimeter of protective sheet, UV-curing may be performed on the LOCA at the corners and/or the portion of the perimeter. Thereafter, the remaining LOCA may be UV-cured and the front light component 3214 may be coupled to the LOCA. By first curing the corner(s) and/or perimeter, the techniques effectively create a barrier for the remaining LOCA and also prevent the formation of air gaps in the LOCA layer, thereby increasing the efficacy of the front light component 3214. In other implementations, the LOCA may be placed near a center of the protective sheet 3226, and pressed outwards towards a perimeter of the top surface of the protective sheet 3226 by placing the front light component 3214 on top of the LOCA. The LOCA may then be cured by directing UV light through the front light component 3214. As discussed above, and as discussed additionally below, various techniques, such as surface treatment of the protective sheet, may be used to prevent discoloration of the LOCA and/or the protective sheet 3226.

While FIG. 32 illustrates a few example components, the electronic device 3200 may have additional features or functionality. For example, the device 3200 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within the device 3200 may reside remotely from the device 3200 in some implementations. In these implementations, the device 3200 may utilize the communication interfaces 3218 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device comprising:
   a bottom support plate;
   a top support plate positioned above the bottom support plate and substantially parallel to the bottom support plate;
   pixel regions between the bottom support plate and the top support plate, wherein a pixel region of the pixel regions comprises:
      a bottom electrode and a hydrophobic layer portion on the bottom support plate;
      an electrowetting oil on the hydrophobic layer portion; and
      an electrolyte solution at least partly covering the electrowetting oil, wherein the electrolyte solution is immiscible with the electrowetting oil;
   a top electrode on the top support plate and in electrical contact with the electrolyte solution;
   spacers extending from the top support plate and toward the bottom support plate, wherein the spacers comprise a first material;
   pixel walls at least partially surrounding each of the pixel regions; and
   a grid of a second material on distal ends of the spacers, wherein the grid of the second material comprises intersecting rows and columns of pixel wall extensions.

2. The electrowetting display device of claim 1, wherein the pixel region is a first pixel region and the pixel regions comprises a second pixel region;
   the first pixel region is separated from the second pixel region at a top surface of a pixel wall of the pixel walls by a width of the top surface of the pixel wall; and
   the width of the top surface of the pixel wall is larger than an area of contact between the top surface of the pixel wall and a spacer of the spacers.

3. The electrowetting display device of claim 1, wherein a distal end of a pixel wall extension of the pixel wall extensions is in contact with a distal end of a pixel wall of the pixel walls.

4. The electrowetting display device of claim 1, wherein a pixel wall extension of the pixel wall extensions is between a distal end of a spacer of the spacers and a distal end of a pixel wall of the pixel walls.

5. The electrowetting display device of claim 1, wherein a width of a pixel wall extension of the pixel wall extensions is larger than a width of a distal end of a spacer of the spacers.

6. The electrowetting display device of claim 1, wherein the hydrophobic layer portion at least partially covers a pixel wall extension of the pixel wall extensions.

7. The electrowetting display device of claim 1, wherein the top support plate comprises the first material.

8. The electrowetting display device of claim 1, wherein the first material comprises a first photoresist material and the second material comprises a second photoresist material.

9. The electrowetting display device of claim 1, wherein at least a portion of a spacer of the spacers is on an intersection of the pixel wall extensions.

10. The electrowetting display device of claim 9, wherein the at least the portion of the spacer has a circular cross-section.

11. The electrowetting display device of claim 9, wherein the at least the portion of the spacer has an elliptical cross-section.

12. The electrowetting display device of claim 1, wherein at least a portion of a spacer of the spacers is substantially midway between two adjacent intersections of the pixel wall extensions.

13. An electrowetting display comprising:
a support plate;
spacers on the support plate and extending perpendicularly away from the support plate by a particular distance, wherein a proximate end of each spacer of the spacers is in contact with the support plate and a distal end of each spacer of the spacers is at the particular distance from the support plate, and, wherein each spacer of the spacers comprises a first material;
a grid of a second material on the distal ends of the spacers, wherein the grid of the second material comprises intersecting rows and columns of pixel wall extensions;
a bottom support plate; and
pixel walls on the bottom support plate, wherein the pixel walls partition pixel regions from one another.

14. The electrowetting display of claim 13, wherein a width of a pixel wall extension of the pixel wall extensions is larger than a width of the distal end of a spacer of the spacers.

15. The electrowetting display of claim 13, further comprising:
a hydrophobic material that at least partially covers a pixel wall extension of the pixel wall extensions.

16. The electrowetting display of claim 13, wherein the support plate comprises the first material.

17. The electrowetting display of claim 13, wherein the first material comprises a first photoresist material and the second material comprise a second photoresist material.

18. The electrowetting display of claim 13, wherein:
a pixel wall of the pixel walls extends vertically from the bottom support plate to a first distance;
the pixel wall has a bottom surface that contacts the bottom support plate and a top surface opposing the bottom surface; and
the electrowetting display comprises:
a first fluid between the pixel walls; and
a second fluid that is immiscible with the first fluid, the second fluid overlying the first fluid.

19. The electrowetting display of claim 18, wherein a pixel wall extension of the pixel wall extensions is in contact with the top surface of the pixel wall and a width of the top surface of the pixel wall is larger than an area of contact between the top surface of the pixel wall and the pixel wall extension.

20. The electrowetting display of claim 13, wherein a pixel wall of the pixel walls has a bottom surface that contacts the bottom support plate and a top surface opposing the bottom surface, and a distal end of a pixel wall extension of the pixel wall extensions is in contact with the top surface of the pixel wall.

* * * * *